United States Patent
Himeno et al.

[11] Patent Number: 6,097,638
[45] Date of Patent: *Aug. 1, 2000

[54] SEMICONDUCTOR MEMORY DEVICE

[75] Inventors: Toshihiko Himeno, Yokohama; Kazushige Kanda; Hiroshi Nakamura, both of Kawasaki, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/022,014

[22] Filed: Feb. 11, 1998

[30] Foreign Application Priority Data

Feb. 12, 1997 [JP] Japan .................................. 9-027748
Dec. 4, 1997 [JP] Japan .................................. 9-333816

[51] Int. Cl.[7] .................................................. G11C 16/06
[52] U.S. Cl. .................................. 365/185.25; 365/185.21
[58] Field of Search ..................... 365/189.05, 185.22, 365/185.21, 185.17, 207, 185.25, 205

[56] References Cited

U.S. PATENT DOCUMENTS 5,357,462 10/1994 Tanaka et al. ................. 365/185.22

Primary Examiner—A. Zarabian
Attorney, Agent, or Firm—Banner & Witcoff, Ltd.

[57] ABSTRACT

An EEPROM employs, as a scheme of detecting data of a memory cell in a memory cell array, a scheme of detecting the potential of a bit line potential sense node, which depends on the relationship in amplitude between the current for charging a bit line from a current source and the discharge current flowing to a selected cell using a sense amplifier. The sense amplifier is arranged in correspondence with one bit line and includes a constant current source transistor for charging the corresponding bit line, a latch circuit for latching memory cell data read out to the bit line potential sense node, and a switch transistor for turning on/off the charge path to the bit line based on data of the latch circuit. In the verify read mode, the cell current between the Vcc node and Vss node of a cell not to be written or a completely written cell can be turned off, so verification can be performed without flowing any unnecessary current.

61 Claims, 25 Drawing Sheets

SEMICONDUCTOR MEMORY DEVICE

BACKGROUND OF THE INVENTION

The present invention relates to a semiconductor memory device and, more particularly, to a semiconductor memory device employing, as a scheme of detecting data in a nonvolatile memory cell, a scheme of detecting the potential depending on the relationship in amplitude between the current for charging a bit line and the cell current and, more particularly, to a sense amplifier therefor.

This application is based on Japanese Patent Application No. 9-27748, filed Feb. 12, 1997 and Japanese Patent Application No. 9-333816, filed Dec. 4, 1997, the content of which is incorporated herein by reference.

An example of such a semiconductor memory device is a nonvolatile semiconductor memory device such as a NAND EEPROM. An EEPROM has advantages including nonvolatility: cell data is not erased even upon turning off the power supply, and strong demand therefor has arisen in recent years. Especially, a flash memory in which data in plural cells can be erased simultaneously and memory cell is constituted by one MOSFET is expected to, e.g., replace a large-capacity magnetic disk. A NAND EEPROM is known as an EEPROM allowing high integration.

FIG. 1 shows the entire arrangement of a simultaneous-erasable NAND EEPROM. This EEPROM comprises a memory cell array (NAND cell array) 11 in which a plurality of NAND memory cells are arrayed in a matrix, a number of bit lines BL extend in the vertical direction, and a number of word lines WL extend in the horizontal direction, a row decoder 12 for selectively driving the word lines WL of the memory cell array 11 on the basis of an address input from an external unit(not shown), a sense amplifier (and write data latch circuit) 13 connected to the bit line BL of the memory cell array 11, a column gate 15 connected to the sense amplifier 13, a column decoder 14 for controlling the column gate 15 on the basis of the address input from the external unit and selecting corresponding bit line BL and sense amplifier 13, an I/O buffer 18 connected to the column gates 15, a voltage step-up circuit 16 for supplying a high voltage necessary for a write or erase operation, and a control circuit 17 serving as an interface between the chip and the external unit.

The row decoder 12 selectively drives the plurality of word lines WL on the basis of an address signal in the data write, erase, or read mode. A predetermined voltage is applied from the voltage step-up circuit 16 to a word line driver (not shown) in the row decoder 12.

A bit line driver (not shown) is also arranged to selectively apply predetermined voltages to the bit lines BL in the data write, erase, or read mode.

FIG. 2A shows a NAND memory cell in the memory cell array 11 shown in FIG. 1.

A plurality of memory cell MOSFETs M1 to M8 each constituted by an N-channel MOSFET having a floating gate and control gate are connected in series. The drain of the MOSFET at one end of this series circuit is connected to the bit line BL through a selection gate NMOSFET Q1 while the source of the MOSFET at the other end is connected to a common source line CS through a selection gate NMOSFET Q2.

The MOSFETs are formed on the same well W. The control electrodes of the memory cells M1 to M8 are respectively connected to word lines WL1 to WL8 continuously arranged in the row direction. The control electrode of the selection MOSFET Q1 is connected to a selection line SL1, and the control electrode of the selection MOSFET Q2 is connected to a selection line SL2.

Each of the memory cell MOSFETs M1 to M8 has a threshold value corresponding to data to be stored. In the NAND flash memory, "1" data storing state (erase state) is defined as a state wherein the memory cell MOSFET is of a depletion type (D type), and the "0" data storing state (write state) is defined as a state wherein the memory cell MOSFET is of an enhancement type (E type). An operation of shifting the threshold value of the memory cell MOSFET which is storing data of level "1" in the positive direction to store data of level "0" is called a "write operation". An operation of shifting the threshold value of the memory cell MOSFET which is storing data of level "0" in the negative direction to store data of level "1" is called an "erase operation".

FIG. 2B shows the distribution of threshold values of memory cell MOSFETs of the NAND cell.

The data write, erase, and read operations of this NAND cell will be described next.

A data write in the NAND cell is sequentially performed from the memory cell MOSFET far from the bit line BL. For an N-channel memory cell MOSFET, a voltage of, e.g., 0V or an intermediate voltage $V_m$ (almost an intermediate voltage between a write voltage $V_{pp}$ and the ground potential) is applied to the bit line BL depending on whether data of level "0" is to be written (the threshold value is to be shifted) or data of level "1" is to be stored (the threshold value is not to be shifted).

The write voltage $V_{pp}$ boosted and capable of obtaining a necessary electric field for shifting the threshold value of the cell is applied to the control gate of a selected memory cell MOSFET. The intermediate voltage $V_m$ necessary for transferring the voltage of the bit line BL to the selected memory cell MOSFET without shifting the threshold value of the cell is applied to the gate of the selection MOSFET and control gates of nonselected memory cell MOSFETs. A voltage of 0V is applied to the selection line SL2, the well, and the common source line CS.

As a result, all the MOSFETs from the selection MOSFET Q1 to the memory cell M8 are turned on. The voltage of the bit line BL is transferred to the drain of the selected memory cell MOSFET through the nonselected memory cell MOSFETs. In this case, a drop in threshold of the memory cell MOSFET need not be taken into consideration because data is normally erased before the write in the memory cell MOSFET, and the threshold value of the memory cell MOSFET does not drop.

When data of level "0" is to be written (when a voltage of 0V is applied to the bit line BL), a strong electric field is applied across the floating gate, channel, and drain of the selected memory cell MOSFET. Electrons are tunnel-injected into the floating gate, and the threshold value shifts in the positive direction. When data of level "1" is to be written (when the intermediate voltage $V_m$ is applied to the bit line BL), the intermediate voltage $V_m$ is applied across the floating gate, channel, and drain of the selected memory cell MOSFET. This suppresses the shift in threshold value in the positive direction, so the threshold value does not change. The intermediate voltage $V_m$ having a certain value, which is applied to the bit line BL to prevent shift in threshold value of the cell, is called a write-inhibiting voltage.

A data erase from the NAND cell is simultaneously performed for all memory cell MOSFETs in the NAND cell.

More specifically, the bit line BL is opened, a voltage of 0V is applied to the control gates of all memory cell MOSFETs, a boosted erase voltage $V_e$ necessary for erasing cell data is applied to the p-type well and n-type substrate. A voltage (e.g., the same potential as the well) at which the gates of the selection MOSFETs Q1 and Q2 are not destructed is applied to the selection lines SL1 and SL2. The same potential as the well (or an open state) is applied to the common source line CS. With this operation, electrons in the floating gates of all memory cell MOSFETs are discharged to the p-type well through the gate insulating film, so the threshold value shifts in the negative direction.

A data read from the NAND cell is performed in the following manner. A reference voltage of 0V is applied to the control gate of the selected memory cell MOSFET, a power supply voltage $V_{cc}$ is applied to the control gates of the remaining memory cell MOSFETs and the gates of the selection MOSFETs, and a voltage of 0V is applied to the well and the common source line CS. The sense amplifier detects whether a current flows to the selected memory cell MOSFET.

In this case, all MOSFETs (including nonselected memory cells) other than the selected memory cell are turned on. When data of level "0" is stored in the selected memory cell MOSFET, this memory cell is turned off, so the potential of the bit line does not change. When data of level "1" is stored in the selected memory cell MOSFET, the memory cell is turned on to discharge the electrons on the bit line, so the bit potential lowers.

FIG. 3 shows a circuit corresponding to some bit lines BL (e.g., five bit lines) in the memory cell array 11 shown in FIG. 1.

In this circuit, a NAND memory cell MC is connected to each bit line BL, a sense amplifier S/A is connected to each bit line BL, and a data bus is connected to the sense amplifiers S/A. Control signals or voltages Latch, CMout, Load, DCB, BLSHF are supplied to each sense amplifier S/A.

The data read operation of the circuit shown in FIG. 3 will be described. First, each bit line BL is precharged to the power supply potential, a specific word line WLi (i=1, 2, ..., 8) is selected, and each sense amplifier S/A senses and amplifies whether the corresponding bit line BL is discharged or not (stores the potential in the precharged state without being discharged) in accordance with the data of the plurality of memory cell MOSFETs M1 to M8 connected to the specific word line.

FIG. 4 shows a conventional example of the sense amplifier S/A shown in FIG. 3.

This sense amplifier comprises a constant current source P-channel MOSFET M1 for charging the bit line BL for a predetermined period on the basis of the precharge control signal CMout, a bit line potential clamp N-channel MOSFET M5 inserted in series with the bit line BL and having a gate to which the control voltage BLSHF is applied, a latch circuit LT for latching memory cell data read out to a bit line potential sense node N3 between the P-channel MOSFET M1 and the N-channel MOSFET M5, an N-channel MOSFET M2 for discharging charges from bit line potential sense node N3 for a predetermined period on the basis of the discharge control signal DCB, a bit line potential sense NMOSFET M3 connected between a first latch node N1 of the latch circuit LT and the ground node and having a gate connected to the bit line potential sense node N3, a latch circuit forcible inversion control NMOSFET M4 connected in series with the NMOSFET M3 between the first latch node N1 of the latch circuit LT and the ground node and turned on in accordance with the control signal Latch supplied to the gate for a predetermined period, and a sense amplifier reset/transfer gate NMOSFET M6 inserted between the bit line potential sense node N3 and a second latch node N2 of the latch circuit LT and gate-driven in accordance with the control signal Load.

The latch circuit LT comprises a flip-flop circuit (latch circuit) constituted by cross-connecting (inversely parallelly connecting) the input nodes and output nodes of a first CMOSFET inverter IV1 and a second CMOSFET inverter IV2.

In this case, the input node (first latch node N1) of the first CMOSFET inverter IV1 is connected to the forcible inversion control NMOSFET M4 as a forcible inversion input node. The input node (second latch node N2) of the second CMOSFET inverter IV2 is connected to the sense amplifier reset NMOSFET M6 and also connected to the data bus as a reset node.

The read, erase, and write operations of the sense amplifier shown in FIG. 4 will be described next.

In the read mode of the EEPROM, the MOSFETs M2 and M6 are turned on for a predetermined period to reset the latch circuit LT, so the node N2 is set at "L" level, and the node N1 is set at "H" level. After this, the bit line BL is charged with the constant current from the MOSFET M1 and discharged to flow a cell current $I_{cell}$ generated on the basis of the threshold state of the memory cell MOSFET while keeping the constant current flowing. After a predetermined time, the MOSFET M4 is turned on.

When data of level "1" is read out from the NAND cell to the bit line BL, the bit line potential lowers because the cell current $I_{cell}$ flows. The MOSFET M3 is turned off, and the node N1 is kept at "H" level in the reset state of the latch circuit LT. Inversely, when data of level "0" is read out from the NAND cell to the bit line BL, the bit line potential is kept at "H" level because no cell current $I_{cell}$ flows. The MOSFET M3 is turned on to forcibly invert data stored in the latch circuit LT, so the node N1 is set at "L" level, and the node N2 is set at "H" level. The data of the node N2 of the latch circuit LT corresponding to the selected column is read out to the data bus.

When data is to be erased from the EEPROM, the sense amplifier is used for a verify read operation. At this time, the sense amplifier operates in the same manner as in the read mode. If data in the memory cell MOSFET has been erased (in case of data of level "1"), the node N1 is set at "H" level, and the node N2 is set at "L" level. If data in the memory cell MOSFET has not been erased (in case of data of level "0"), the node N1 is set at "L" level, and the node N2 is set at "H" level. On the basis of this data, if any one of the nodes N2 of all sense amplifiers S/A operating simultaneously is set at "H" level, the erase is incomplete, and a signal for erase is output to perform erase again.

In the write mode of the EEPROM, write/write-inhibiting data is input, and data is input from the data bus to the node N2 of the latch circuit LT corresponding to the selected column. When data of level "0" is input, the node N2 is set at "L" level. When data of level "1" is input, the node N2 is set at "H" level. Upon turning on the MOSFET M6, the data of the node N2 is transferred to the bit line BL through the MOSFET M6. In the write mode, the channel in the selected NAND cell is boosted to the intermediate potential. Therefore, when data of "L" level is supplied to the bit line BL, the data is written in the cell. When data of "H" level is applied to the bit line BL, no data is written.

To realize highly reliable EEPROM capable of operating at a high speed, the threshold distribution of the memory cell MOSFETs after being written must be narrow. As described above, every time data is written, the written data is read out (verify read) and compared with data to be written. If the writing is insufficient, the write operation is continued. Upon confirming that the written data agrees with that to be written, the write operation is ended.

In such a verify read mode, the latch circuit LT is not reset, and the reading is performed while keeping the written data left in the sense amplifier. This read operation is the same as in the read mode except the absence of reset.

Therefore, the node N2 of the latch circuit LT corresponding to a cell not to be written or a completely written cell is set at "H" level. The node N2 of the latch circuit LT corresponding to an incompletely written cell is set at "L" level. When data of the nodes N2 are directly used to perform the write operation again, data can be written in only incompletely written cells.

In the read mode, a voltage of 0V is applied to the selected word line. In the verify read mode, however, a verify voltage $V_{pvf}$ (>0V) is applied to the selected word line. Data is rewritten in memory cell MOSFETs each having a threshold value from 0V to $V_{pvf}$, and the write operation is repeated until the minimum value of the write threshold distribution is equal to or larger than the verify voltage $V_{pvf}$. With this arrangement, a sufficient margin for the write variation to the read voltage is ensured.

As described above, in the read mode, the sense amplifier shown in FIG. 4 is discharged while flowing the cell current $I_{cell}$ with keeping the flow of the constant current by the MOSFET M1. This scheme can shorten the read time as compared to a scheme (e.g., the bit line precharge/discharge scheme) of charging the bit line to a floating state and then flowing the cell current to sense the decrease in bit line potential.

However, in the sense amplifier shown in FIG. 4, the cell current (constant current) from the MOSFET M1 always flows in the read mode, so the ground potential floats depending on the data pattern stored in the cell. More specifically, when the constant current flows to a parasitic resistance r between the memory cell MC and ground to drop the voltage, the ground terminal (source of the selection MOSFET SL2) of the memory cell MC slightly floats from the ground potential. Especially, when data in all cells have been erased, a large constant current flows into all the bit lines BL. As a result, the source-side potential of the NAND memory cell MC (e.g., ground potential) tends to float because of the voltage drop of the resistance component of the common source line CS using a diffusion layer at a source-side terminal of the NAND cell, so the cell current decreases. In addition, floating of the ground potential generates a back bias effect, so the apparent threshold value of the cell becomes high.

The write/erase operation of the EEPROM is slower than that of, e.g., a DRAM, and some EEPROMs employ a page write scheme or a page read scheme to realize a high-speed write/read.

In the page write scheme, data to be written are written simultaneously from a plurality of column lines (bit lines) in a plurality of memory cells connected to one row line (word line) (written in units of pages). In the page read scheme, data stored in a plurality of memory cells connected to one row line are simultaneously read out to a plurality of column lines and sense-amplified (read out in units of pages).

For this EEPROM, assuming the verify operation based on the page write scheme, problems due to floating of potential of the common source line CS (to be referred to as floating of the ground potential hereinafter) will be described below.

For a page size of, e.g., 512 columns, assume that all cells not subjected to data writing have been erased, and that one memory cell MOSFET has a very high write speed. Assume that, in the first writing, about 0 to 1V is written in the cell with the highest write speed while each of the remaining cells has a threshold voltage of 0V or less.

When a verify read is performed in this state, a current flows to cells of the 511 columns except the cell with the highest write speed, so a voltage drop occurs due to the parasitic resistance component r of the interconnection (e.g., the diffusion layer) on the source side of the NAND cells, so the ground potential floats.

Since the cell current decreases due to floating of the ground potential, the cell with the highest write speed appears to be sufficiently written (i.e., the threshold voltage is higher than the actual threshold voltage) although data written in the cell is insufficiently in fact. It is consequently determined upon verification that the write in the cell with the highest write speed is complete.

However, in a page read after completion of writing in all cells, the writing has been ended for most cells, and no cell current flows, so floating of the ground potential is minimum.

In the read operation when the floating of the ground potential is minimum, the cell current is apparently more likely to flow to the cell with the highest write speed than in verification after the first writing. For this reason, the writing in the cell with the highest write speed may be insufficient to result in a write failure although it is determined that the writing is complete. This also poses the problem of reliability.

In summary, in the conventional semiconductor memory device which employs, as a sense scheme, a scheme of discharging the bit lines and sensing the cell current while charging the bit lines in reading out data from the nonvolatile memory cells, and as a read scheme, a scheme of simultaneously reading out data stored in the plurality of memory cells connected to the plurality of bit lines and detecting the data, and also has a verify mode after the writing operation in the memory cells, when a memory cell having a high write speed is included in the plurality of memory cells, the potential of the common source line of the plurality of memory cells floats in the verify operation after the write to cause a write failure.

BRIEF SUMMARY OF THE INVENTION

Accordingly, it is an object of the present invention to provide a semiconductor memory device which can prevent the potential of the common source line of a plurality of memory cells from floating in the verify operation after a write operation even when a memory cell having a high write speed is included in the plurality of memory cells to prevent a write failure.

According to one aspect of the present invention, there is provided a semiconductor memory device comprising a plurality of bit lines; a plurality of nonvolatile memory cells arranged in correspondence with the bit lines, having a memory cell transistor for storing data upon setting a threshold value within a first range or a second range, simultaneously selected and controlled to discharge or not to discharge corresponding bit lines in accordance with the threshold value, and having paths of the discharged charges commonly connected; and a plurality of sense amplifiers arranged in correspondence with the bit lines for detecting memory cell data read out to bit line potential sense nodes of the bit lines, each of the sense amplifiers comprising a current source arranged in correspondence with each of the bit lines for charging the corresponding bit line at a predetermined timing; a latch circuit for latching data corresponding to the range of the threshold value of the memory cell transistor; and a switch circuit for turning on/off a charge path of the corresponding bit line based on a latch data of the latch circuit.

According to another aspect of the present invention, there is provided a semiconductor memory device comprising a plurality of bit lines; a plurality of nonvolatile memory cells arranged in correspondence with the bit lines, having a memory cell transistor for storing data upon setting a threshold value within a first range or a second range, simultaneously selected and controlled to discharge or not to discharge corresponding bit lines in accordance with the threshold value, and having paths of the discharged charges commonly connected; a plurality of sense amplifiers arranged in correspondence with the bit lines for detecting memory cell data read out to bit line potential sense nodes of the bit lines, each of the sense amplifiers comprising: a current source arranged in correspondence with each of the bit lines for charging the corresponding bit line at a predetermined timing; and a latch circuit for latching data corresponding to the range of the threshold value of the memory cell transistor; and a control circuit for decreasing a amplitude of a current of the current source for charging the bit line in a verify mode to be smaller than that in a read mode.

According to still another aspect of the present invention, there is provided a semiconductor memory device comprising a plurality of word lines and a plurality of bit lines crossing the word lines; a memory cell array in which a plurality of memory cells are arrayed in a matrix in correspondence with cross points of the word lines and the bit lines; and sense/latch circuits arranged in correspondence with the bit lines for detecting cell data read out from a selected memory cell to a bit line potential sense node of the bit line and latch data transferred from an external unit, wherein the semiconductor memory device has a read test mode for, in a read test, selectively charging a bit line of a column to be subjected to a read operation based on data latched by the sense/latch circuit to read out cell data from a memory cell and detect a bit line potential.

According to the semiconductor memory device of the present invention, even when a memory cell having a high write speed is included in a plurality of memory cells, the potential of the common source line of the plurality of memory cells can be prevented from floating in the verify operation after a write operation to prevent a write failure.

Further, according to the semiconductor memory device of the present invention, when the actual performance of the device is to be measured by a reliability improvement test in development, the device can be properly evaluated while excluding the influence of any intrinsic defective bit. A test before redundancy replacement is also enabled. In addition, the amount of variation in threshold voltage which is generated by floating of the source line potential due to the cell current of a selected cell can be measured while excluding the influence of floating of the source line potential due to the cell current of the cells of the remaining columns. A current leakage between adjacent bit lines, the threshold voltages of cells, and the distribution of the threshold voltages can also be easily measured.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A preferred embodiment of a semiconductor memory device according to the present invention will now be described with reference to the accompanying drawings.

First Embodiment

Figure 5:
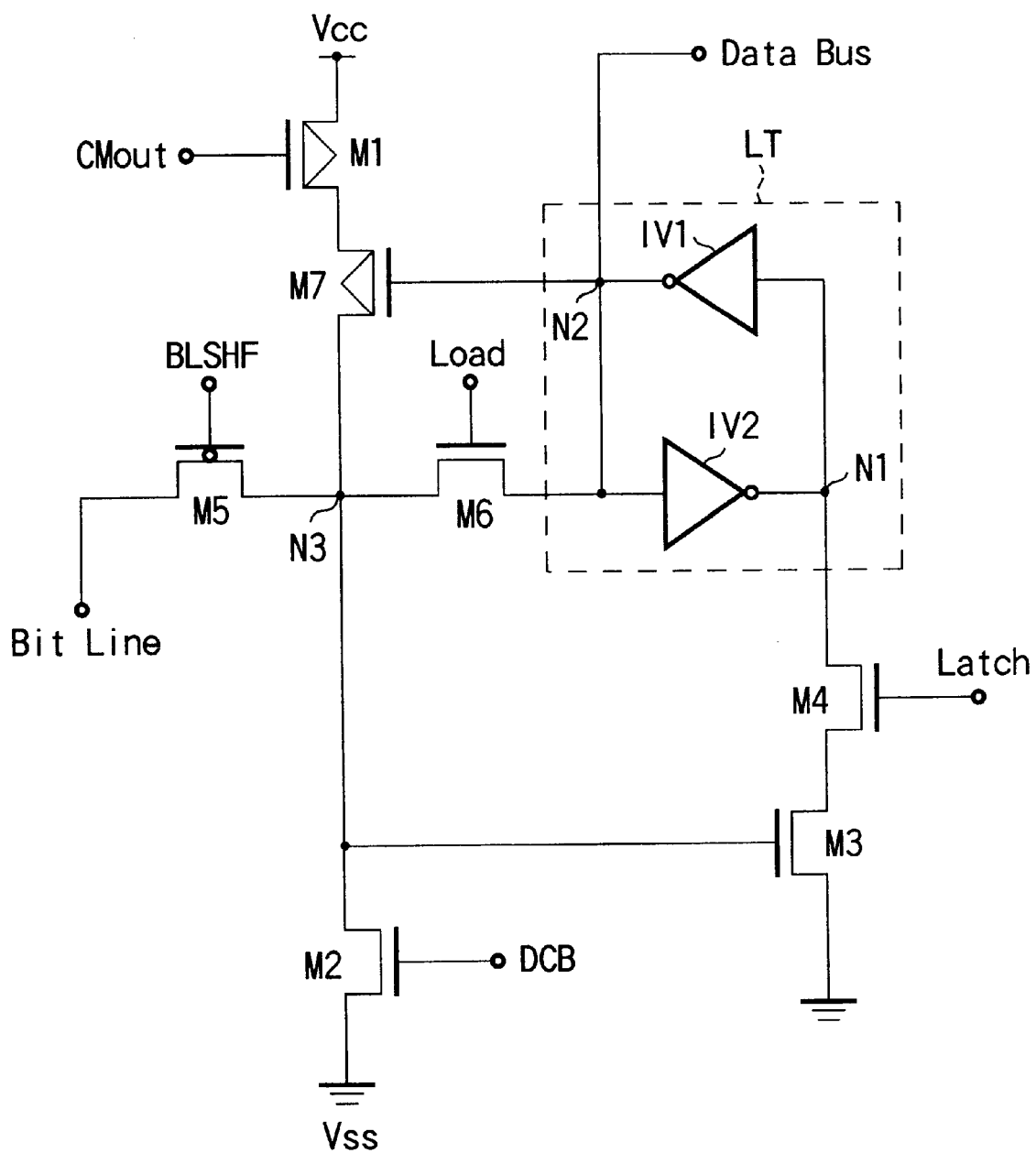
FIG. 5 is a circuit diagram showing a sense amplifier in a NAND EEPROM as a semiconductor memory device according to a first embodiment of the present invention.

FIG. 5 shows a sense amplifier for a NAND EEPROM as a semiconductor memory device according to a first embodiment of the present invention. The entire arrangement of the NAND EEPROM is the same as that of the prior art shown in FIGS. 1 to 3.

Figure 1:
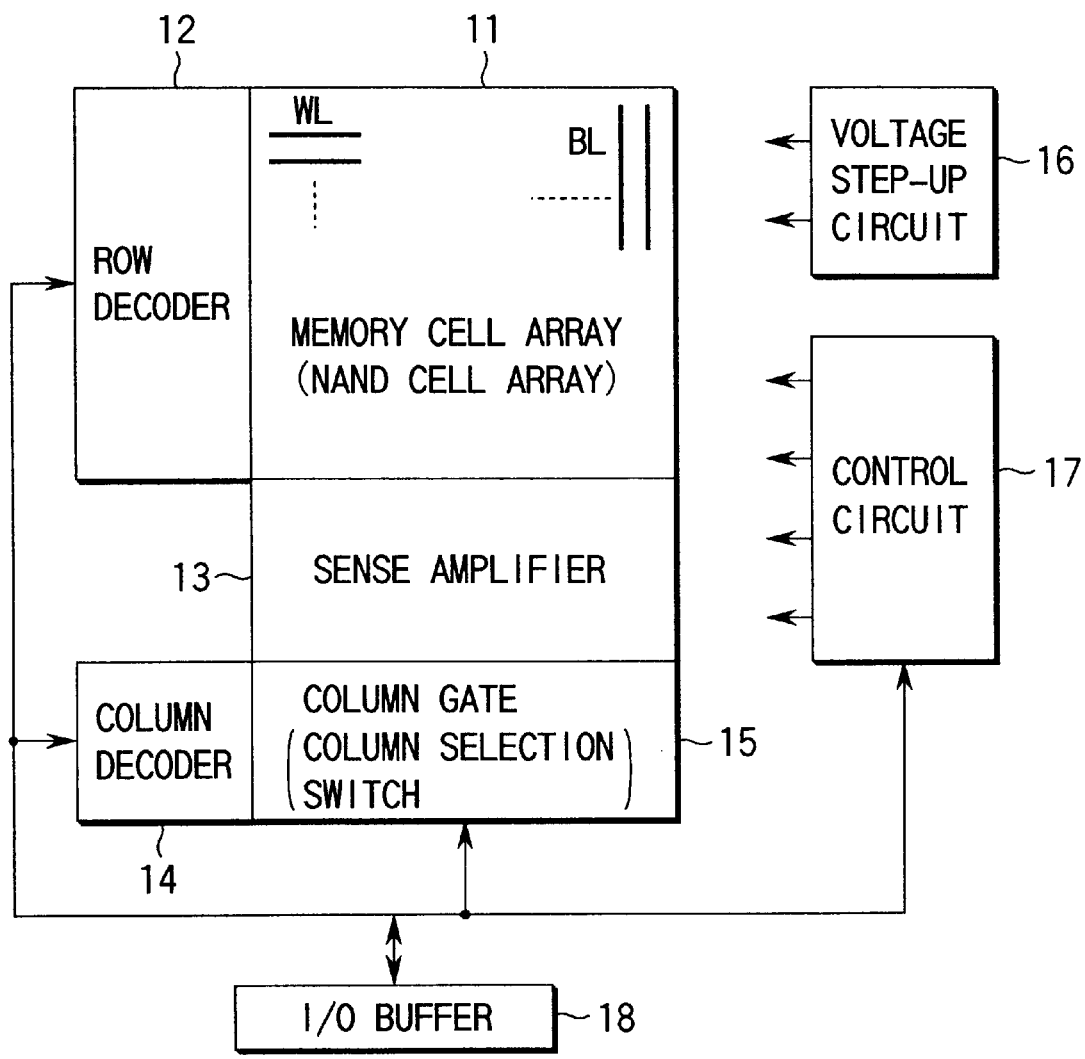
FIG. 1 is a block diagram showing the general entire arrangement of a simultaneous-erasable NAND cell EEPROM.
Figure 2A:
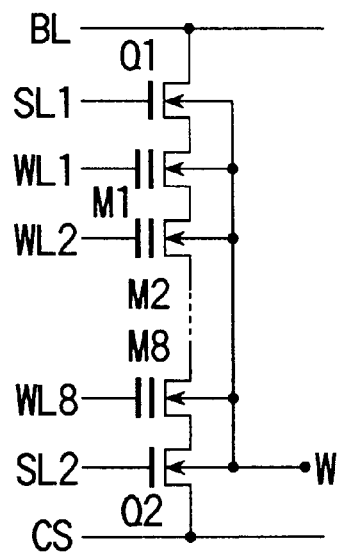
FIG. 2A is a circuit diagram showing a NAND cell of a memory cell array shown in FIG. 1.
Figure 2B:
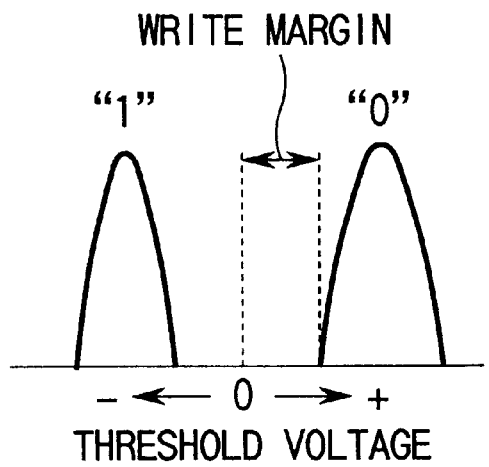
FIG. 2B is a graph showing an example of the distribution of threshold voltages of memory cell MOSFETs.
Figure 3:
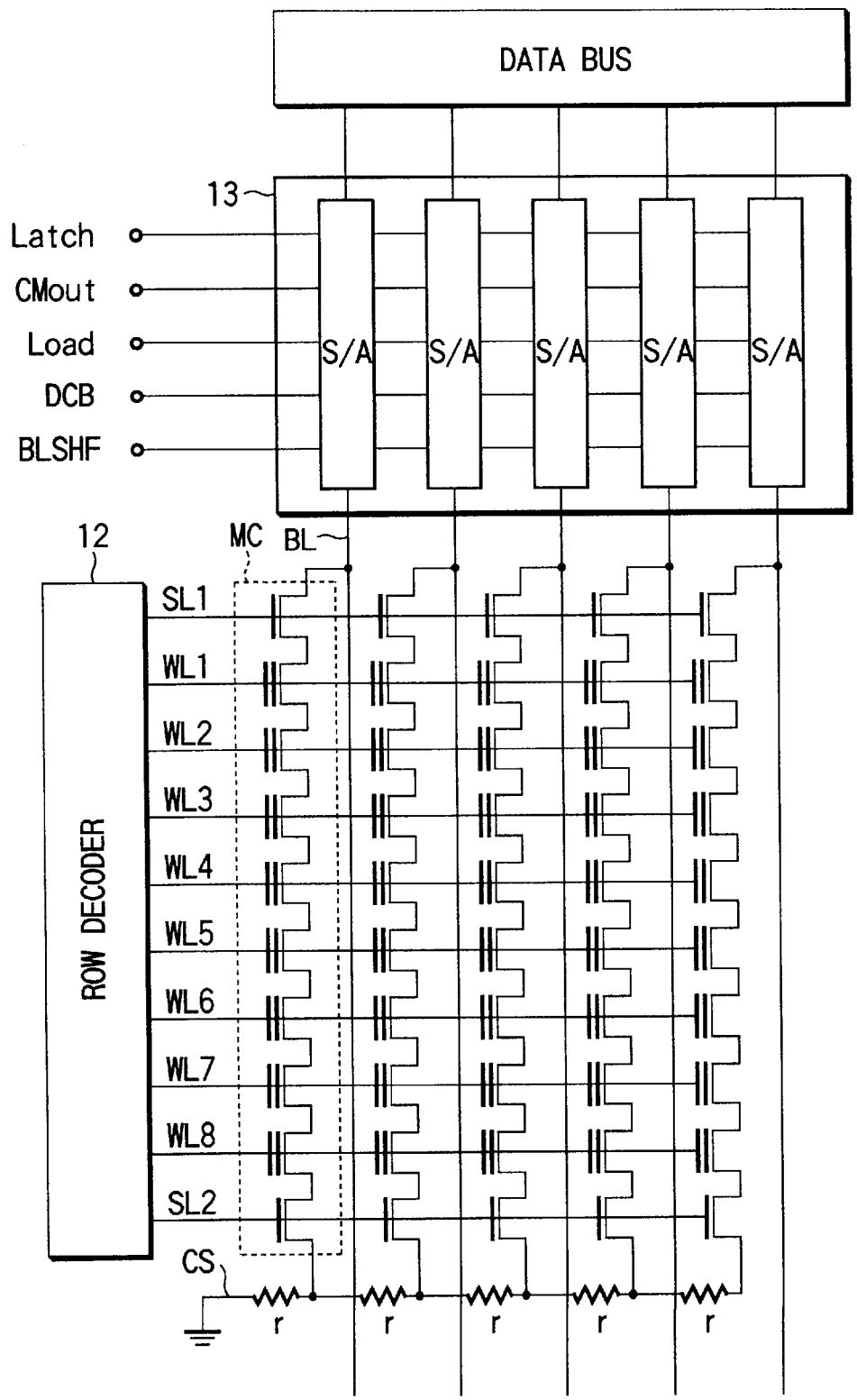
FIG. 3 is a block diagram showing details of the memory cell array and a sense amplifier shown in FIG. 1.

The sense amplifier shown in FIG. 5 employs, as a sense scheme, a so-called current continuous flow scheme (a scheme of discharging bit lines by a cell current and sensing it while charging the bit lines in reading out data from cells) with which a sense amplifier S/A detects the potential of the bit line potential sense node, which depends on the relationship in amplitude between the bit line load current for charging bit lines BL from a current source and the discharge current flowing to a selected cell in detecting data from memory cells of a memory cell array 11 shown in FIG. 1 in which a plurality of nonvolatile memory cells are arrayed in a matrix. The sense amplifier employs a read scheme of simultaneously reading out data stored in the plurality of memory cells connected to the plurality of bit lines and detecting the data. The sense amplifier is arranged in units of bit lines BL of the NAND EEPROM having a verify mode after writing in the memory cells (FIG. 3).

Figure 4:
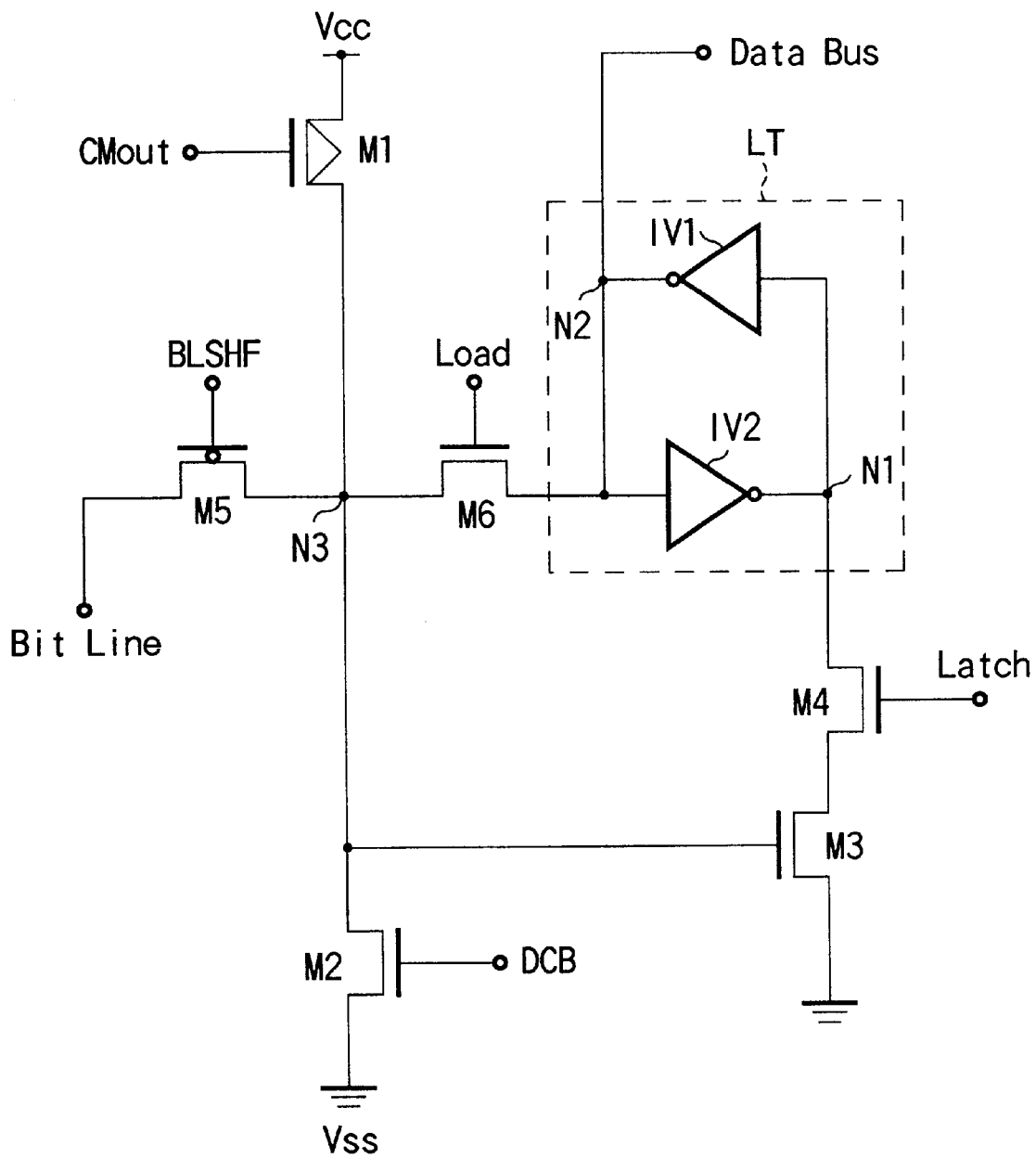
FIG. 4 is a circuit diagram showing an example of the sense amplifier shown in FIG. 3.

This sense amplifier has the same arrangement as that of the conventional sense amplifier shown in FIG. 4 except that a bit line load current control P-channel MOSFET M7 is inserted between a bit line load circuit P-channel MOSFET M1 and a bit line potential sense node N3. The same reference numerals as in FIG. 4 denote the same parts in FIG. 5.

More specifically, the sense amplifier shown in FIG. 5 comprises the constant current source (bit line load circuit) P-channel MOSFET M1 for charging the bit line BL for a predetermined period on the basis of a precharge control signal CMout, a bit line potential clamp N-channel MOSFET M5 inserted in series with the bit line BL and having a gate to which a control voltage BLSHF is applied, a latch circuit LT for latching memory cell data read out to the bit line potential sense node N3 between the P-channel MOSFET M1 and the N-channel MOSFET M5, a reset circuit N-channel MOSFET M2 for discharging the bit line potential sense node N3 for a predetermined period on the basis of a discharge control signal DCB, a bit line potential sense NMOSFET M3 connected between a first latch node N1 of a pair of complementary nodes of the latch circuit LT and the ground node and having a gate connected to the bit line potential sense node N3, an N-channel MOSFET M4 (the MOSFET M4 controls forcible inversion of the latch circuit LT) connected in series with the N-channel MOSFET M3 between the first latch node N1 of the latch circuit LT and the ground node and turned on in response to a control signal Latch supplied to the gate for a predetermined period, a sense amplifier reset/transfer gate N-channel MOSFET M6 inserted between the bit line potential sense node N3 and a second latch node N2 of the pair of complementary nodes of the latch circuit LT, gate-driven in accordance with a control signal Load (the control signal Load is set at the ground potential in the read mode and in the verify read mode), turned off in reading out data from memory cells, and turned on in resetting the latch circuit LT and writing data in memory cells, and the above-described MOSFET M7 serving as a switch circuit for switching the charge path to the bit line potential sense node N3 in accordance with data of the latch circuit LT.

The constant current source P-channel MOSFET M1 is controlled to charge the bit line BL at the end of the discharge period of the reset circuit. The charge potential of the bit line BL is not limited to a power supply potential $V_{cc}$.

The latch circuit LT comprises a flip-flop circuit (latch circuit) constituted by cross-connecting (inversely parallelly connecting) the input nodes and output nodes of a first CMOSFET inverter IV1 and a second CMOSFET inverter IV2.

In this case, the input node (first latch node N1) of the first CMOSFET inverter IV1 is connected to the forcible inversion control N-channel MOSFET MOSFET M4 as a forcible inversion input node. The input node (second latch node N2) of the second CMOSFET inverter IV2 is connected to the sense amplifier reset N-channel MOSFET M6 and also connected to a data bus as a reset node.

The switch circuit is turned on in the reset state wherein the node N1 of the latch circuit LT is set at "H" level, and turned off in the forcibly inverted state wherein the node N1 of the latch circuit LT is set at "L" level.

This switch circuit comprises the P-channel MOSFET M7 inserted between the constant current source P-channel MOSFET M1 and the bit line potential sense node N3, having a gate connected to the second storage node N2 (the node N2 is set at "L" level in the reset state and "H" level in the forcibly inverted state) of the latch circuit LT, and turned on/off in accordance with the data of the second storage node N2.

The read, erase, and write operations of the sense amplifier shown in FIG. 5 will be described next. The operation of this sense amplifier is basically the same as that of the conventional sense amplifier shown in FIG. 4 except the operation of the added MOSFET M7.

Figure 6:
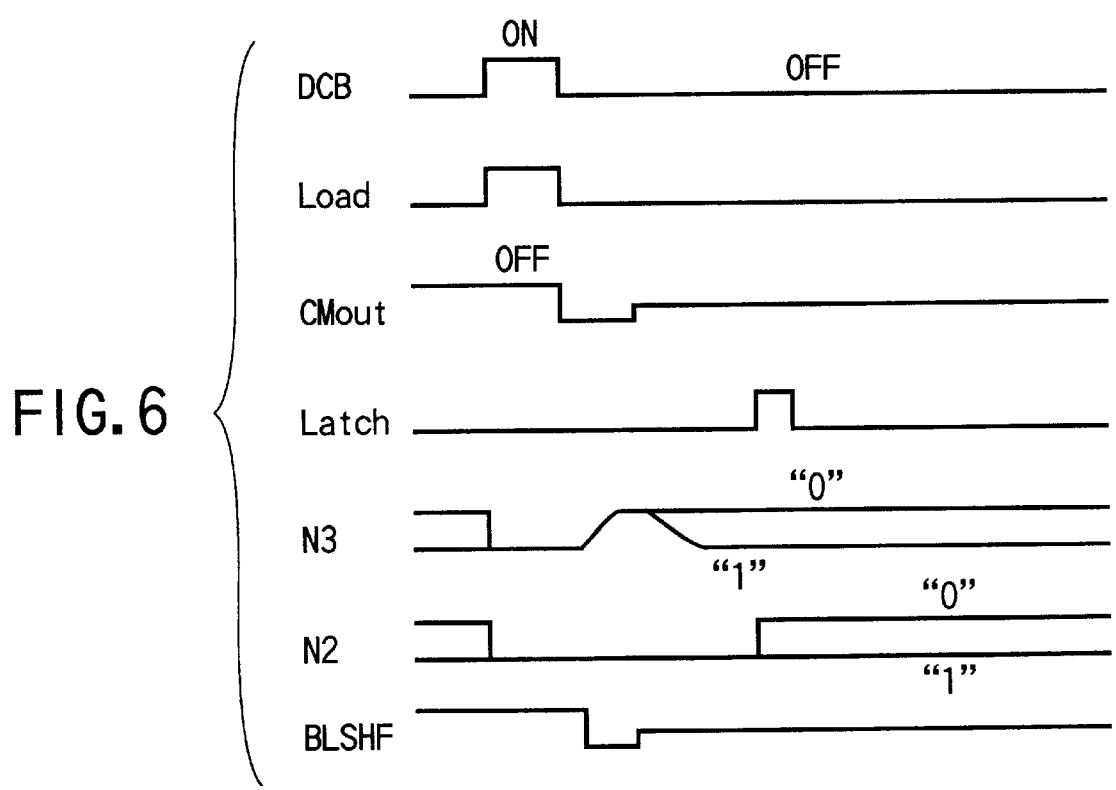
FIG. 6 is a chart showing a read operation of the sense amplifier of the first embodiment.

In the read mode of the EEPROM, the MOSFETs M2 and M6 are turned on for a predetermined period to reset the latch circuit LT such that the node N2 is set at "L" level, and the node N1 is set at "H" level, as shown in FIG. 6. After this reset, the bit line BL is charged with the constant current from the MOSFET M1. The bit line BL is discharged by a cell current $I_{cell}$ generated depending on the threshold state of the cell MOSFET while keeping the constant current flow, and the MOSFET M4 is turned on after a predetermined time.

When data of level "1" is read out from the NAND cell to the bit line BL, the bit line potential lowers because the cell current $I_{cell}$ flows. The MOSFET M3 is turned off, and the node N2 is kept at "L" level in the reset state of the sense amplifier.

When data of level "0" is read out from the NAND cell to the bit line BL, the bit line potential is kept at "H" level because no cell current $I_{cell}$ flows. The MOSFET M3 is turned on to forcibly invert the data stored in the latch circuit LT. The node N1 is set at "L" level, and the node N2 is set at "H" level. Immediately after the data of level "0" is sensed, the MOSFET M7 is turned off to stop charging.

In an erase of the EEPROM, the sense amplifier is used for a verify read. At this time, the sense amplifiers operate in the same manner as that in the read mode. If the cell data has been erased (in case of data of level "1"), the node N1 is set at "H" level, and the node N2 is set at "L" level. If the cell data has not been erased (in case of data of level "0"), the node N1 is set at "L" level, and the node N2 is set at "H" level. On the basis of this data, if any one of the nodes N2 of all sense amplifiers operating simultaneously is set at "H" level, the erase is incomplete, and a signal for an erase operation is output to perform an erase operation again.

In the write mode of the EEPROM, write/write-inhibiting data is input, and data is input from the data bus to the node N2 of the latch circuit LT. When data of level "0" is input (when data is to be written), the node N2 is set at "L" level. When data of level "1" is input (when data is not to be written), the node N2 is set at "H" level.

In the ON state of the MOSFET M6, the data of the node N2 is transferred to the bit line BL through the MOSFET M6. In the write mode, the channel in the selected NAND cell is boosted to the intermediate potential. Therefore, when data of "L" level is applied to the bit line BL, the data is written. When data of "H" level is applied to the bit line BL, no data is written.

In such a verify read mode, the latch circuit LT is not reset, and the read is performed while keeping the write data left in the sense amplifier. This read operation is the same as described above except the absence of reset.

Therefore, the node N2 of the latch circuit LT corresponding to a cell not to be written or a completely written cell is set at "H" level. The node N2 of the latch circuit LT corresponding to an incompletely written cell is set at "L" level. When data of the nodes N2 are directly used to the write again, data can be written in only the incompletely written cells.

At this time, since the node N2 of the latch circuit LT corresponding to a cell not to be written or a completely written cell is set at "H" level, the MOSFET M7 in the charge path of the cell is turned off, so no current flows to the bit line BL. Since the node N2 of the latch circuit LT corresponding to an incompletely written cell is set at "L" level, the MOSFET M7 in the charge path of the cell is turned on, so the constant current flows into the bit line BL.

More specifically, only the bit lines BL corresponding to cells determined as incompletely written cells and determined as additional write targets are charged. For this reason, excessive current consumption is suppressed, and floating of the ground potential of the common source line CS to which the source-side terminals of the plurality of memory cells selected simultaneously are commonly connected is minimized. In addition, even when the cells not to be written are not charged, latch data is not destroyed because the bit line potential sense node N3 is kept at "L" level, and the sense input MOSFET M3 is turned off, so no problem is posed.

As described above, when the bit line load current is switched on/off in accordance with the data of the node N2 of the latch circuit LT, the cell current between the $V_{cc}$ node and the $V_{ss}$ node of a cell not to be written or a completely written cell is turned off in the verify read mode, so verification can be performed without flowing any unnecessary current.

At this time, floating of the ground potential of the common source line CS is suppressed, and an increase in threshold voltage of the cell MOSFET due to the back bias effect and an apparent variation in threshold voltage of the cell MOSFET due to a decrease in cell current can be prevented. Simultaneously, the decrease in cell current can be suppressed because the ground potential floating effect is smaller than that in the read mode, and this allows a stricter verify operation. Especially, since the cell current of a completely written cell is turned off in the additional write, a large effect can be obtained in verification of the cell subjected to an additional write.

In the NAND EEPROM using the above-described sense amplifier S/A, the MOSFET M7 for turning on/off the bit line charge path in accordance with the data of the sense amplifier S/A is inserted, so charging of bit lines which do not require the reading can be stopped to suppress floating of the ground potential. In cells not to be written in the verify mode or completely written cells, the output terminals of sense amplifiers are set at the same potential (in this case, "H" level). In addition, since these cells need not be read, the MOSFET M7 inserted and connected to the bit line BL corresponding to these cells can be turned off to stop charging of the bit line BL. Therefore, any excessive cell current for an incompletely written cell not to be written can be turned off to suppress floating of the ground potential. In addition, since the cell current unnecessary for reading is turned off, the current consumption can be reduced.

Furthermore, since floating of the ground potential is minimized as compared to the read mode, the decrease in cell current depending on the data pattern in the peripheral cells can be suppressed. This allows to prevent any apparent variation in threshold voltage due to the decrease in cell current in verification during the write operation. In addition, since the cell current unnecessary for reading is turned off, the current need not be flowed to a column corresponding to an address at which no data is to be written in a divisional write mode (e.g., write in units of bytes), so a stricter verify margin than that in the conventional verify write mode can be set.

If the allowance of the current consumption in the verify read mode is the same as the conventional allowance, an increase in parasitic resistance component r of the source-side interconnection of the memory cell is allowable. The interval between contacts of the metal interconnections which normally contact the diffusion layer of the source-side interconnection at a predetermined interval can be decreased, so an increase in pattern area can be suppressed.

Other embodiments of the semiconductor memory device according to the present invention will be described. The same portions as those of the first embodiment will be indicated in the same reference numerals and their detailed description will be omitted.

Second Embodiment

Figure 7:
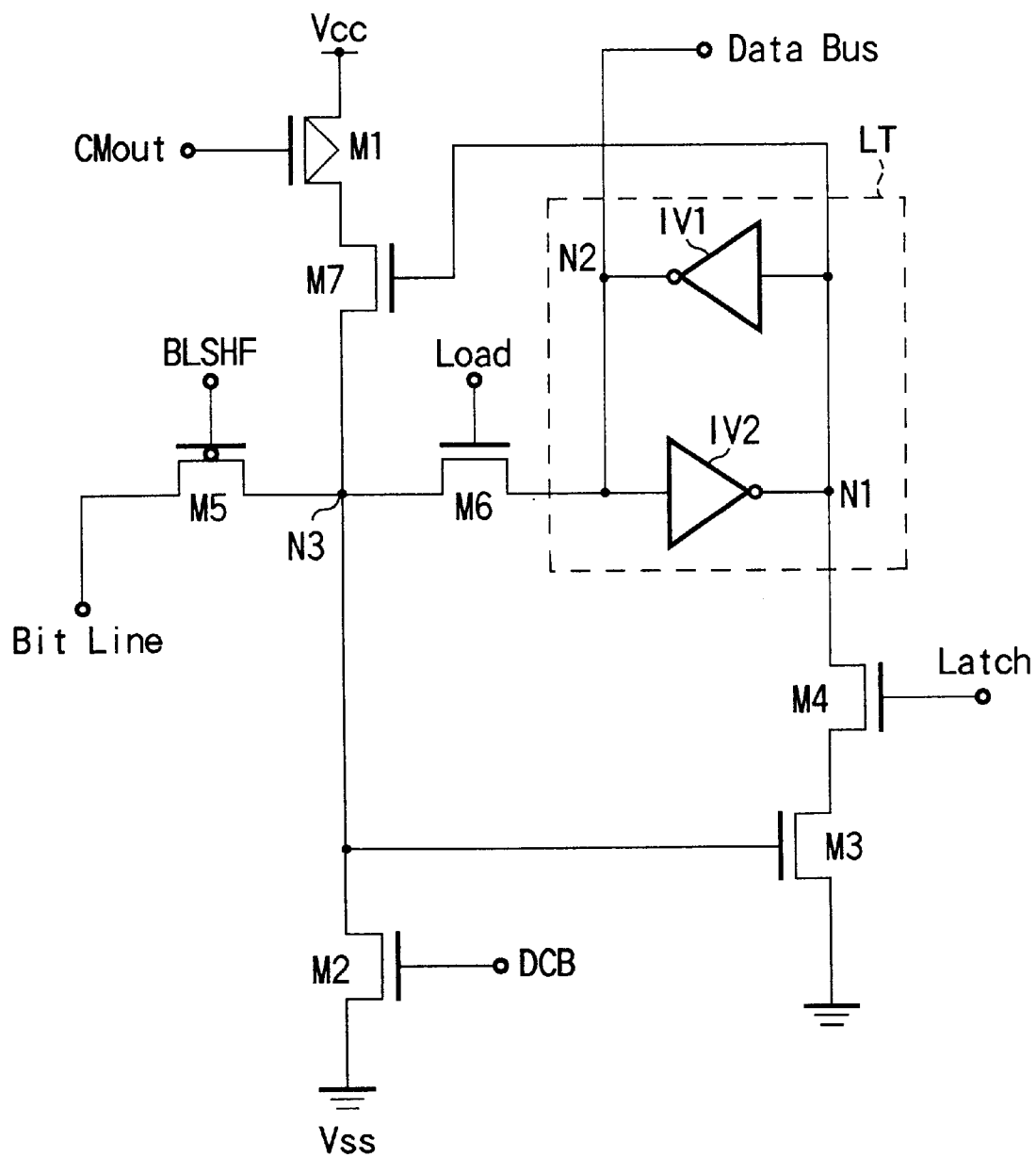
FIG. 7 is a circuit diagram showing a sense amplifier in a NAND EEPROM as a semiconductor memory device according to a second embodiment of the present invention.

FIG. 7 shows a sense amplifier for a NAND EEPROM as a semiconductor memory device according to a second embodiment of the present invention. The entire arrangement of the NAND EEPROM is the same as that of the prior art shown in FIGS. 1 to 3. The sense and read schema of the second embodiment are the same as those of the first embodiment. The second embodiment also has a verify mode after the writing operation.

This sense amplifier has the same arrangement as that of the first embodiment shown in FIG. 5 except details of the switch circuit for turning on/off the charge path to the bit line potential sense node N3 in accordance with data of the latch circuit LT.

More specifically, the switch circuit comprises an N-channel MOSFET M7 inserted between the constant current P-channel MOSFET M1 and the bit line potential sense node N3 and having a gate connected to the first storage node N1 (the first storage node N1 is set at "H" level in the reset state and "L" level in the forcibly inverted state) of the latch circuit LT.

The operation is the same as in the first embodiment. When the node N1 is set at "L" level, and a node N2 is set at "H" level, the bit line charge current path is turned off, and any unnecessary cell current is suppressed.

Third Embodiment

Figure 8:
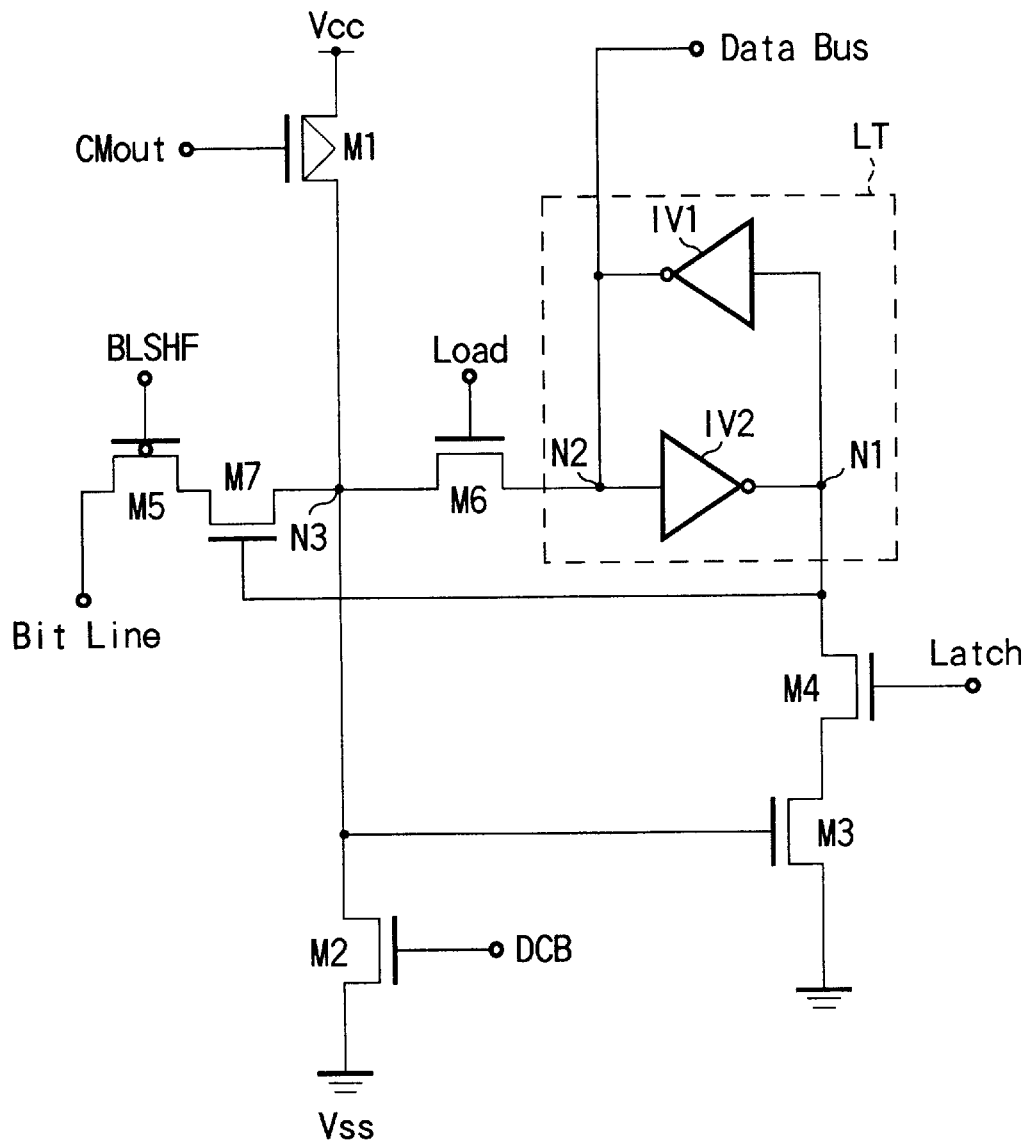
FIG. 8 is a circuit diagram showing a sense amplifier in a NAND EEPROM as a semiconductor memory device according to a third embodiment of the present invention.

FIG. 8 shows a sense amplifier for a NAND EEPROM as a semiconductor memory device according to a third embodiment of the present invention. The entire arrangement of the NAND EEPROM is the same as that of the prior art shown in FIGS. 1 to 3. The sense and read schema of the third embodiment are the same as those of the first embodiment. The third embodiment also has a verify mode after the writing operation.

The sense amplifier of the second embodiment shown in FIG. 7 uses a switch circuit for turning on/off the charge path to the bit line potential sense node N3 in accordance with the data of the latch circuit LT. The sense amplifier of the third embodiment has the same arrangement as that of the second embodiment shown in FIG. 7 except that the sense amplifier uses a switch circuit for turning on/off the charge path between the bit line potential sense node N3 and the memory cell in accordance with the data of the latch circuit LT.

More specifically, the switch circuit comprises an N-channel MOSFET M7 inserted between the bit line potential sense node N3 and the bit line potential clamp MOSFET M5 and having a gate connected to the first storage node N1 of the latch circuit LT.

The operation is the same as in the first embodiment. When the node N1 is set at "L" level, and a node N2 is set at "H" level, the bit line charge current path is turned off, and any unnecessary cell current is suppressed.

Fourth Embodiment

Figure 9:
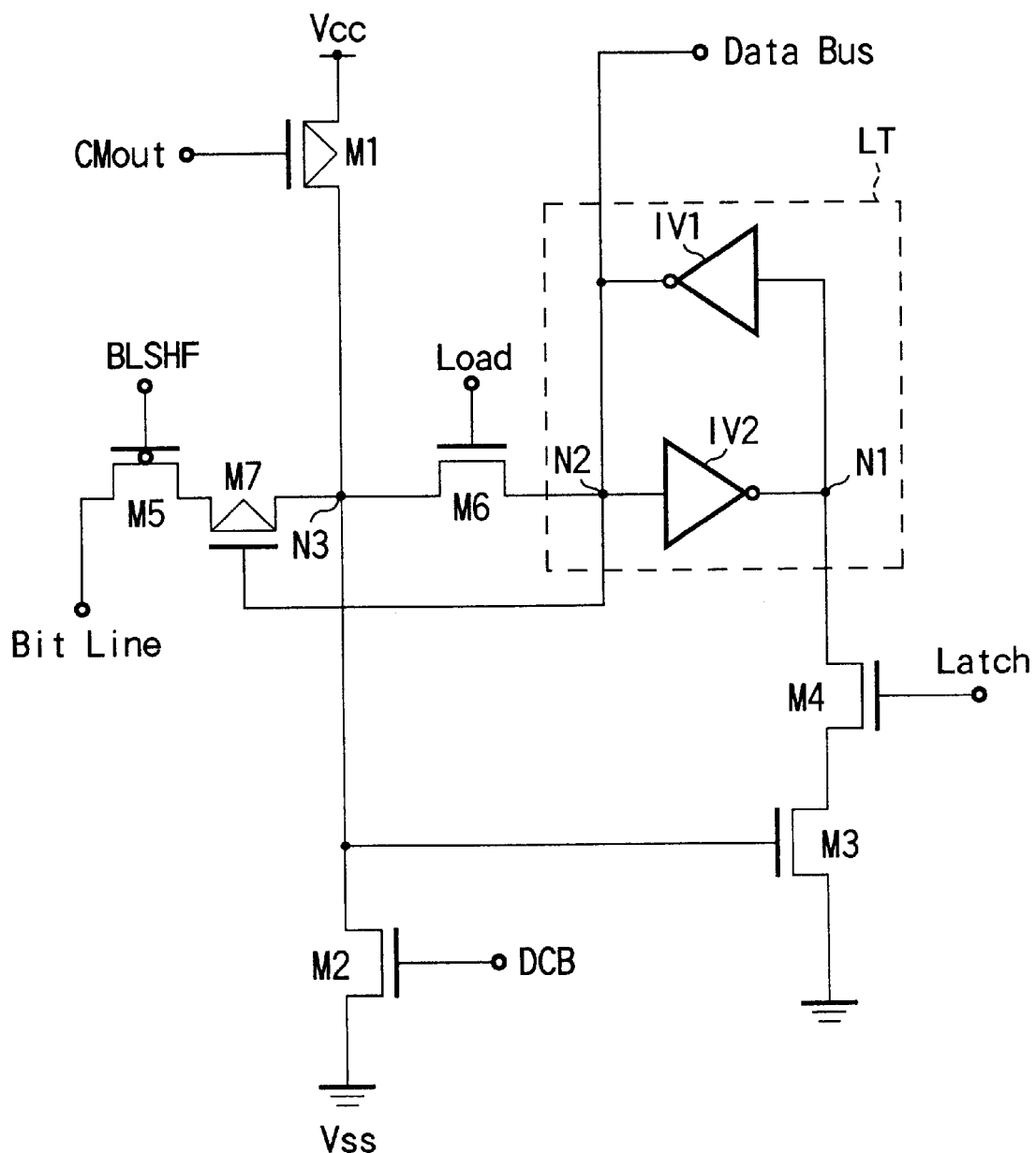
FIG. 9 is a circuit diagram showing a sense amplifier in a NAND EEPROM as a semiconductor memory device according to a fourth embodiment of the present invention.

FIG. 9 shows a sense amplifier for a NAND EEPROM as a semiconductor memory device according to a fourth embodiment of the present invention. The entire arrangement of the NAND EEPROM is the same as that of the prior art shown in FIGS. 1 to 3. The sense and read schema of the fourth embodiment are the same as those of the first embodiment. The fourth embodiment also has a verify mode after the writing operation.

This sense amplifier has the same arrangement as that of the first embodiment shown in FIG. 5 except a switch circuit for turning on/off the charge path between a bit line potential sense node N3 and the memory cell in accordance with the data of the latch circuit LT.

More specifically, the switch circuit comprises a P-channel MOSFET M7 inserted between the bit line potential sense node N3 and the bit line potential clamp MOSFET M5 and having a gate connected to the second storage node N2 of the latch circuit LT.

The operation is the same as in the first embodiment. When the node N1 is set at "L" level, and a node N2 is set at "H" level, the bit line charge current path is turned off, and any unnecessary cell current is suppressed.

Fifth Embodiment

Figure 10:
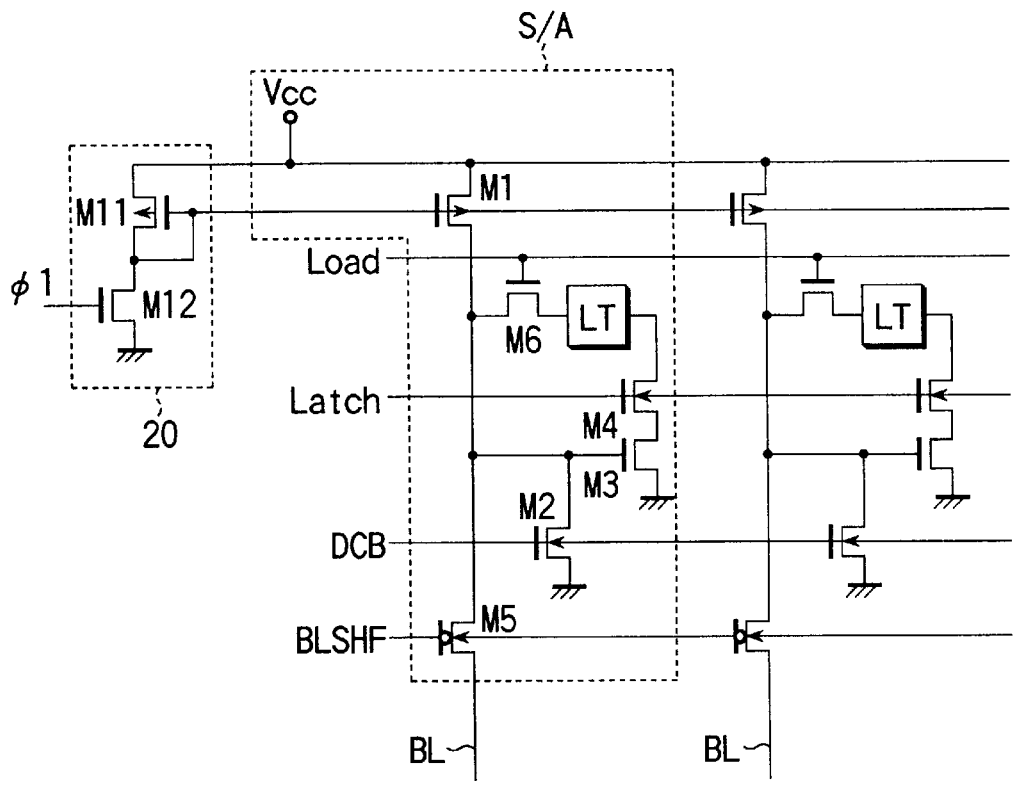
FIG. 10 is a circuit diagram showing a sense amplifier in a NAND EEPROM as a semiconductor memory device according to a fifth embodiment of the present invention.

FIG. 10 shows a sense amplifier for a NAND EEPROM as a semiconductor memory device according to a fifth embodiment of the present invention. The entire arrangement of the NAND EEPROM is the same as that of the prior art shown in FIGS. 1 to 3. The sense and read schema of the fifth embodiment are the same as those of the first embodiment. The fifth embodiment also has a verify mode after the writing operation.

The fifth embodiment is different from the first embodiment shown in FIG. 5 in that a bit line load current control circuit 20 is connected to the sense amplifiers S/A. The bit line load current control circuit 20 controls, e.g., the bit line load resistance such that the amplitude of the current (bit line load current) from the current source for charging the bit line in the verify mode becomes smaller than that in the read mode.

In the scheme of discharging the bit line by flowing the cell current and sensing it while charging the bit line, the cell current and the read time has a trade-off relationship. Generally, when the amplitude of bit line load current is to be made small, the read time of the sense amplifier is generally prolonged. To the contrary, to perform a high-speed read, a large cell current is required. In a normal EEPROM, the read operation is set in accordance with the maximum cell current which can be flowed to the memory cell to make the operation speed as high as possible. Since the time of the verify read operation is much shorter than that of the write operation, the verify read time may be slightly prolonged in practice. As described above, a smaller bit line load current is effective to reduce the cell current amount.

Assume that the product of the bit line load current necessary for charging the bit line to the "H" level and the charge time is constant. In this case, to make balance with the normal read, the sense amplifier reading time may be prolonged in inverse proportion to the bit line load current. Assuming that in the verify read mode, a page read is to be performed while setting the bit line load current to be, e.g., half that in the normal read mode, the read time may be twice the read time. In the normal read mode, the bit line load current is preferably set to be as large as possible to rapidly charge the bit line to the "H" level in reading out data of level "0". However, in order to increase the bit line potential lowering rate in reading out data of level "1", the bit line load current must be set to be smaller than the maximum cell current which can be flowed through the memory cell.

More specifically, in the bit line load current control circuit 20 shown in FIG. 10, a P-channel MOSFET M11 whose gate and drain are connected to each other and an N-channel MOSFET M12 having a gate to which a precharge control signal φ1 is supplied are series-connected between the $V_{cc}$ node and the $V_{ss}$ node.

The gate of a constant current source (bit line load circuit) P-channel MOSFET M1 of each sense amplifier S/A connected to each bit line is connected to the gate of the P-channel MOSFET M11 to constitute a current mirror circuit.

Figure 11:
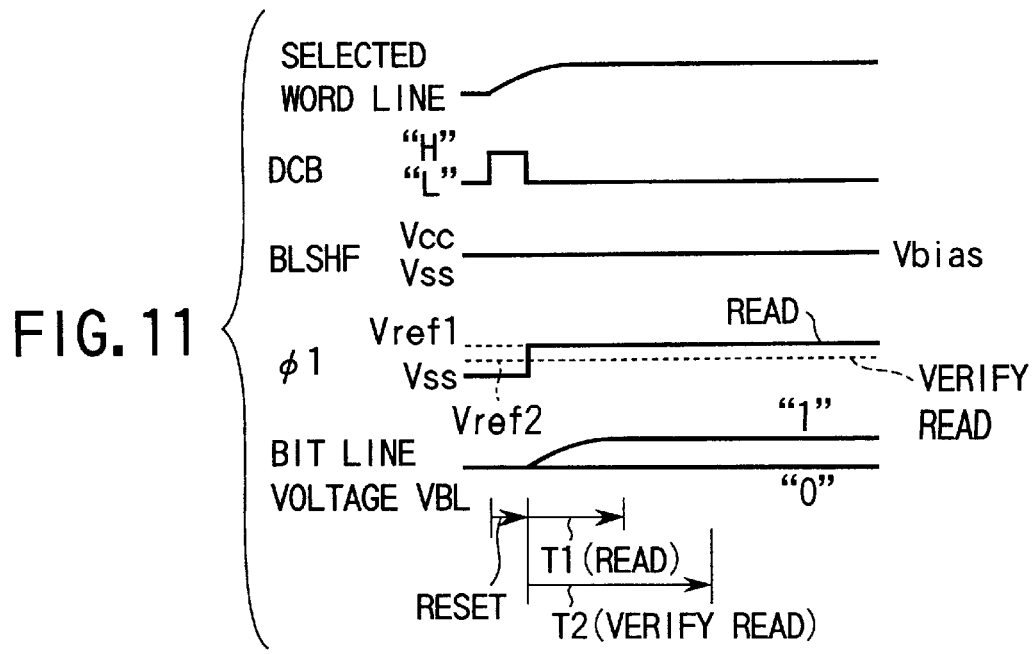
FIG. 11 is a chart showing an operation of the sense amplifier of the fifth embodiment.

FIG. 11 shows the waveforms of the control signals of the bit line load current control circuit 20 shown in FIG. 10 and the operation waveforms of the sense amplifier S/A.

In the read mode, the sense amplifier S/A is reset for a predetermined period at the rising of the selected word line voltage. After this, the precharge control signal φ1 is set at a first voltage level $V_{ref1}$ to turn on the N-channel MOSFET M12, and at the same time, a gate potential BLSHF of the bit line potential clamp MOSFET M5 is set at a predetermined voltage level $V_{bias}$ lower than a power supply potential $V_{cc}$ to increase the sensitivity.

When data of level "1" is read out from the memory cell, the bit line is discharged to flow the cell current, so a bit line potential $V_{BL}$ does not change. When data of level "0" is read out from the memory cell, charging of the bit line is started. The bit line potential $V_{BL}$ gradually rises and is sensed after a predetermined read time T1.

The verify read mode is different from the normal read mode in that the precharge control signal φ1 is set at a second voltage level $V_{ref2}$ lower than the first voltage level $V_{ref1}$ to increase the bit line load resistance, and when data of level "0" is read out from the memory cell, the potential is sensed after a predetermined read time T2 (>T1).

Sixth Embodiment

Figure 12:
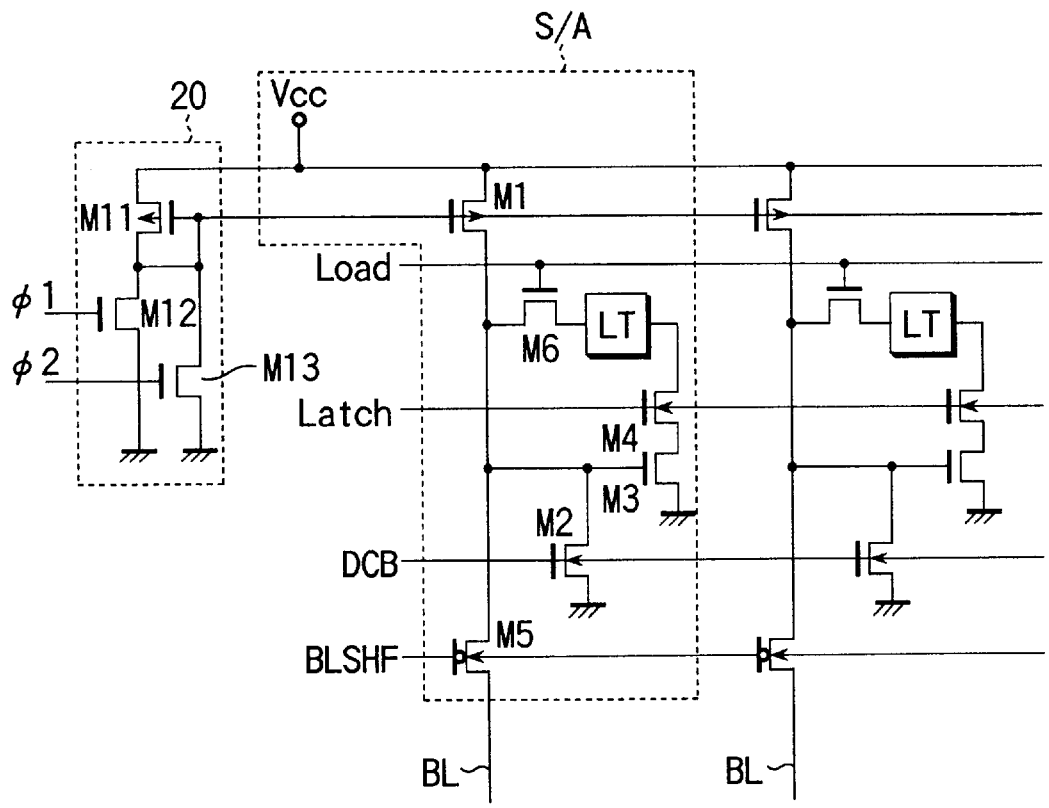
FIG. 12 is a circuit diagram showing a sense amplifier in a NAND EEPROM as a semiconductor memory device according to a sixth embodiment of the present invention.

FIG. 12 shows a sense amplifier for a NAND EEPROM as a semiconductor memory device according to a sixth embodiment of the present invention. The entire arrangement of the NAND EEPROM is the same as that of the prior art shown in FIGS. 1 to 3. The sixth embodiment is a modification of the fifth embodiment.

This sense amplifier has the same arrangement as that of the fifth embodiment except that an N-channel MOSFET M13 having a gate to which a precharge control signal φ2 is supplied is arranged in parallel with the N-channel MOSFET M12 having a gate to which the precharge control signal φ1 is supplied. The two MOSFETs are simultaneously turned on to increase the cell current in the read mode because the precharge control signals φ1 having two voltage levels $V_{ref1}$ and $V_{ref2}$ can hardly be generated to change the cell current between the verify read mode and the normal read mode.

Figure 13:
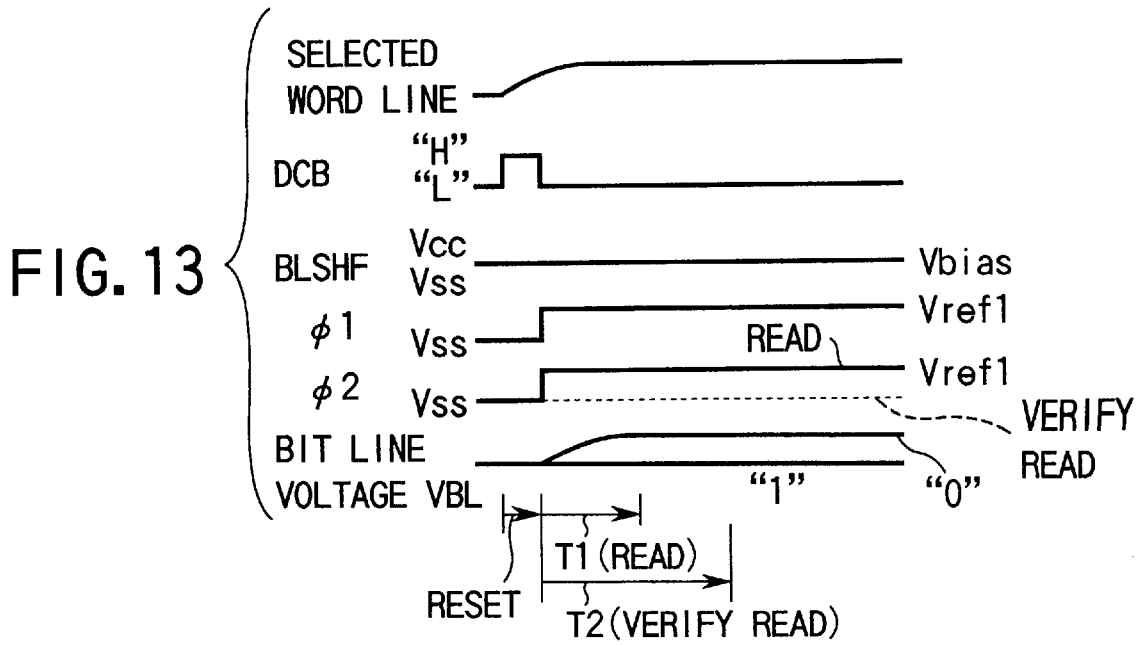
FIG. 13 is a chart showing an operation of the sense amplifier of the sixth embodiment.

FIG. 13 shows the waveforms of the control signals and the operation waveforms of the sense amplifier S/A of the sixth embodiment.

In the read mode, the sense amplifier S/A is reset for a predetermined period at the rising of the voltage of a selected word line. After this, the precharge control signals φ1 and φ2 are set at the first voltage level $V_{ref1}$ to turn on the N-channel MOSFETs M12 and M13, and at the same time, the gate potential BLSHF of the bit line potential clamp MOSFET M5 is set at a predetermined voltage level $V_{bias}$ lower than a power supply potential $V_{cc}$ to increase the sensitivity.

When data of level "1" is read out from the memory cell, the bit line is discharged by flowing the cell current, so the bit line potential $V_{BL}$ does not change. When data of level "0" is read out from the memory cell, charging of the bit line is started. The bit line potential $V_{BL}$ gradually rises and is sensed after a predetermined read time T1.

The verify read mode is different from the normal read mode in that the precharge control signal φ2 is kept at "L" level ($V_{ss}$) to turn off the N-channel MOSFET M13 (decrease the bit line load resistance), and when data of level "0" is read out from the memory cell, the potential is sensed after a predetermined read time T2 (>T1).

Figure 16:
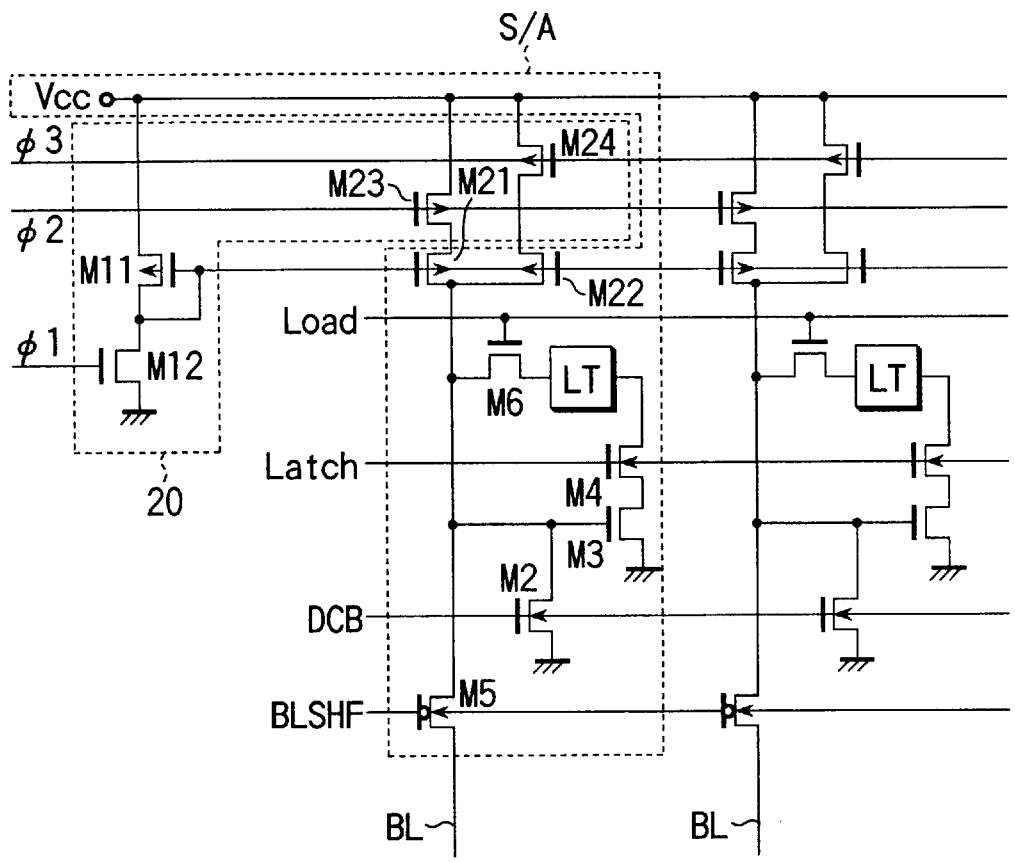
FIG. 16 is a circuit diagram showing a sense amplifier in a NAND EEPROM as a semiconductor memory device according to an eighth embodiment of the present invention.

When floating of ground potential of the memory cell is to be prevented by changing the bit line load resistance, as in the fifth or sixth embodiment, the following means may also be used to change the bit line load resistance:

(1) the number of N-channel MOSFETs serving as the current source of the bit line load circuit P-channel MOSFET is changed, (2) the number of P-channel MOSFETs as the current source of the bit line load circuit P-channel MOSFET is changed (FIG. 14), and (3) the number of bit line load circuit P-channel MOSFETs is changed (FIG. 16).

Seventh Embodiment

Figure 14:
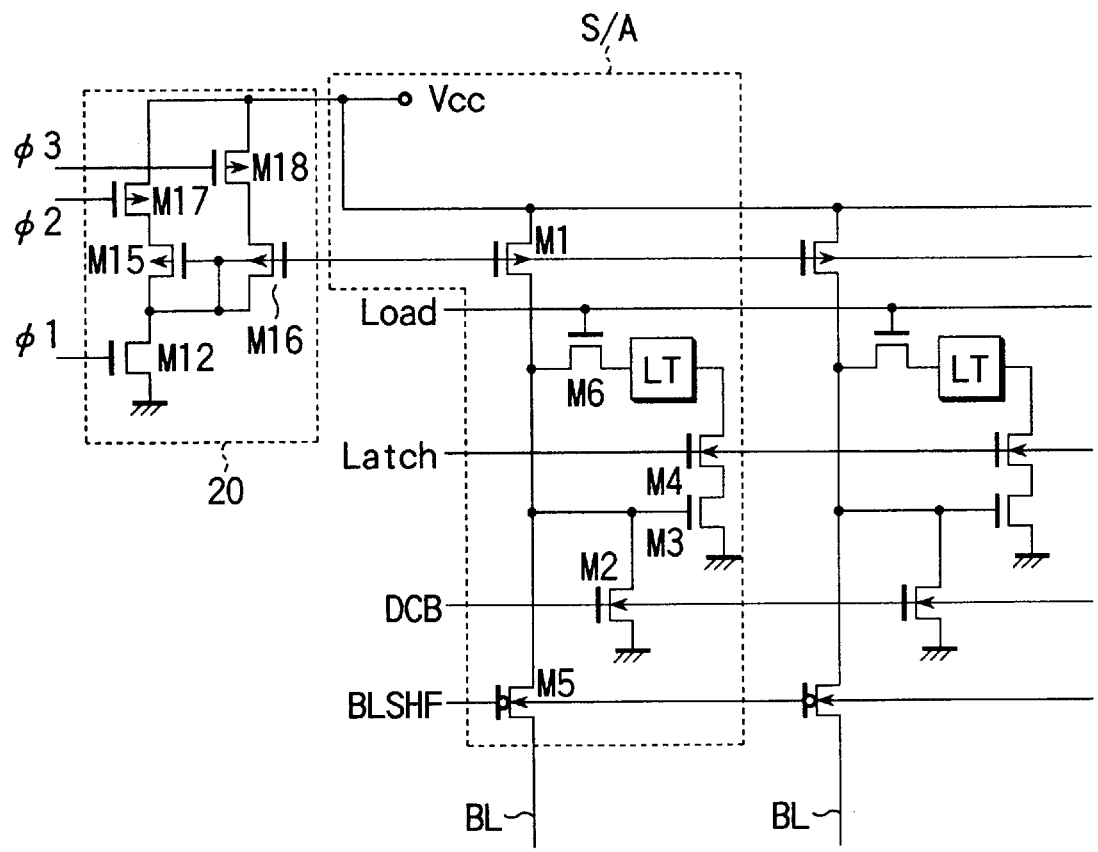
FIG. 14 is a circuit diagram showing a sense amplifier in a NAND EEPROM as a semiconductor memory device according to a seventh embodiment of the present invention.
Figure 15:
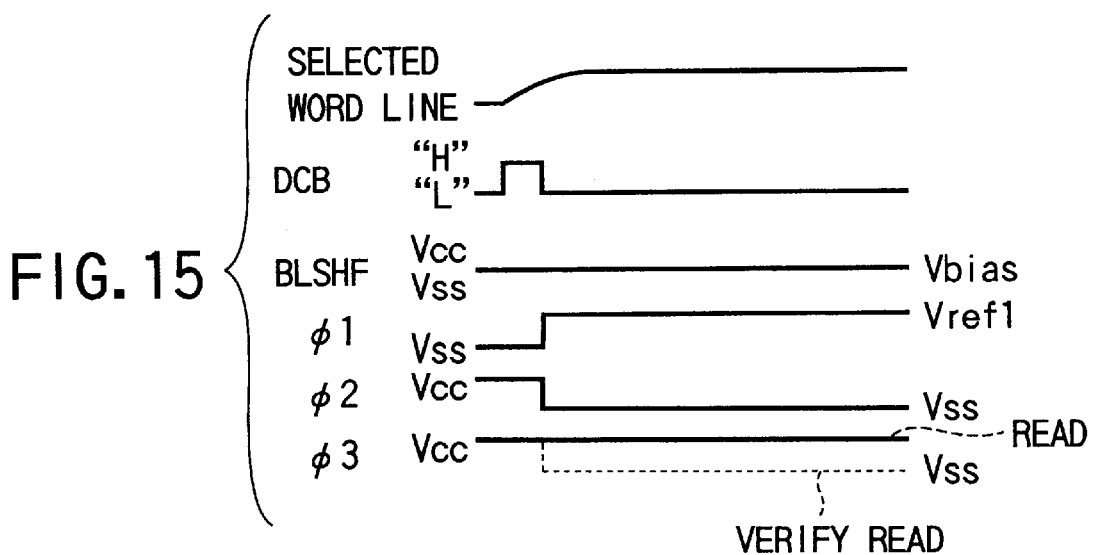
FIG. 15 is a chart showing an operation of the sense amplifier of the seventh embodiment.

FIG. 14 is a circuit diagram of a bit line load current control circuit 20 according to the above-described modification (2). FIG. 15 shows the waveforms of the control signals of the bit line load current control circuit 20 and the operation waveforms of the sense amplifier S/A.

Referring to FIG. 14, the bit line load current control circuit 20 has the same arrangement as that of the fifth embodiment shown in FIG. 10 except that two systems of P-channel MOSFETs M15 and M16 are connected as the current source of the bit line load circuit P-channel MOSFET M1 of each sense amplifier S/A connected to each bit line, and in each system, a switch P-channel MOSFET M17 or M18 is inserted in series with the current source P-channel MOSFET M15 or M16, and precharge control signals φ2 and φ3 are supplied to the gates of the switch P-channel MOSFETs M17 and M18 of the two systems.

As shown in FIG. 15, in the normal read mode, the sense amplifier is reset for a predetermined period at the rising of the voltage of a selected word line. After this, a precharge control signal φ1 is set at the first voltage level $V_{ref1}$ to turn on the N-channel MOSFET M12, and at the same time, the gate potential BLSHF of the bit line potential clamp MOSFET M5 is set at a predetermined voltage level $V_{bias}$ lower than the power supply potential $V_{cc}$ to increase the sensitivity. After reset, the precharge control signal φ2 is lowered from the level $V_{cc}$ to a level $V_{ss}$ to turn on the P-channel MOSFET M17. At this time, the precharge control signal φ3 is kept at the level $V_{cc}$ to turn off the P-channel MOSFET M18.

When data of level "1" is read out from the memory cell, the bit line is discharged to flow the cell current, so the bit line potential $V_{BL}$ does not change. When data of level "0" is read out from the memory cell, charging of the bit line is started. The bit line potential $V_{BL}$ gradually rises and is sensed after a predetermined read time T1.

The verify read mode is different from the read mode in that the precharge control signal φ3 is also lowered from the level $V_{cc}$ to the level $V_{ss}$ after reset to turn on the P-channel MOSFET M18, thereby decreasing the current in the path between the P-channel MOSFETs M17 and M15 (decreasing the current of the constant current source P-channel MOSFET M1 connected to the bit line), and when data of level "0" is read out from the memory cell, the potential is sensed after a predetermined read time T2 (>T1).

Eighth Embodiment

Figure 17:
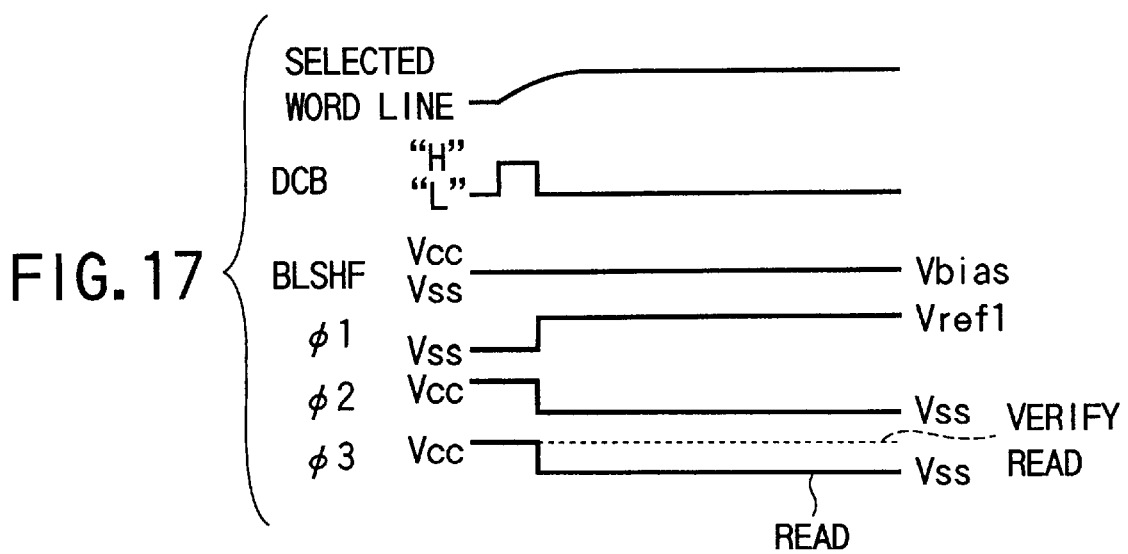
FIG. 17 is a chart showing an operation of the sense amplifier of the eighth embodiment.

FIG. 16 is a circuit diagram of a bit line load current control circuit 20 according to the above-described modification (3). FIG. 17 shows the waveforms of the control signals of the bit line load current control circuit 20 and the operation waveforms of a sense amplifier S/A.

Referring to FIG. 16, the bit line load current control circuit 20 has the same arrangement as that of the fifth embodiment shown in FIG. 10 except that two systems of bit line load circuit P-channel MOSFETs M21 and M22 connected to each bit line are arranged, and in each system, a switch P-channel MOSFET M23 or M24 is inserted in series with the bit line load circuit P-channel MOSFET M21 or M22, and precharge control signals φ2 and φ3 are supplied to the gates of the switch P-channel MOSFETs M23 and M24 of the two systems.

As shown in FIG. 17, in the read mode, the sense amplifier S/A is reset for a predetermined period at the rising of the voltage of a selected word line. After this, a precharge control signal φ1 is set at the first voltage level $V_{ref1}$ to turn on the N-channel MOSFET M12, and at the same time, the gate potential BLSHF of the bit line potential clamp MOSFET M5 is set at a predetermined voltage level $V_{bias}$ lower than a power supply potential $V_{cc}$ to increase the sensitivity. After reset, the precharge control signals φ2 and φ3 are lowered from the level $V_{cc}$ to a level $V_{ss}$ to turn on the P-channel MOSFETs M23 and M24.

When data of level "1" is read out from the memory cell, the bit line is discharged to flow the cell current, so a bit line potential $V_{BL}$ does not change. When data of level "0" is read out from the memory cell, charging of the bit line is started. The bit line potential $V_{BL}$ gradually rises and is sensed after a predetermined read time T1.

The verify read mode is different from the normal read mode in that after reset, the precharge control signal φ3 is kept at the level $V_{cc}$ to turn off the P-channel MOSFET M24, thereby decreasing the bit line load current, and when data of level "0" is read out from the memory cell, the potential is sensed after a predetermined read time T2 (>T1).

As described above, according to the first to eighth embodiments, verification can be performed in the verify read mode without flowing any unnecessary current. For this reason, floating of the ground potential of the common source line CS is suppressed, an increase in the threshold voltage of the cell MOSFET due to the back bias effect according to the floating, and an apparent variation in the threshold voltage of the cell MOSFET due to the decrease in the cell current are prevented. Simultaneously, the decrease in the cell current is suppressed because the effect of floating of the ground potential is minimized as compared to the read mode, and this allows a stricter verify operation. Especially, since the cell current of a completely written cell is turned off in an additional write operation, a large effect can be obtained in verifying the additionally written cell. For this reason, a semiconductor memory device which can suppress floating of the potential of the common source line of a plurality of memory cells in verification after the write to prevent a write failure even when some of these memory cells have a high write speed can be provided.

The present invention can be applied not only to a nonvolatile semiconductor memory device which employs the scheme of discharging the bit line to flow the cell current and sensing it while charging the bit line in reading out data from the cell, as described above, but also to a nonvolatile semiconductor memory device which employs a precharge/discharge scheme of precharging a read-cell-side bit line and a reference-side bit line for a predetermined time before the data read, discharging the read-cell-side bit line and the reference-side bit line in reading out the data to generate a potential difference between the two bit lines, and sense-amplifying this potential difference by a sense amplifier, in which discharging is started before completion of precharge to cancel, within the precharge period, the difference in potential between the reference-side common source line and the read-cell-side common source line after the precharge (i.e., the precharge period and the discharge period are partially made to overlap).

When the actual performance of a semiconductor memory device is to be measured by a test (e.g., a write/erase stress test or a read stress test) for improving the reliability in development of a semiconductor memory device, a nondefective device comprising nondefective cells including no intrinsic defective cells is required. This is because the mechanism of defect of a so-called intrinsic defective cell for which read/write/erase cannot be performed is essentially different from that of a defective cell detected by the reliability test, and these defects must be discriminated in the reliability test. If the yield lowers due to some reason, and a device including so-called intrinsic defective cells is subjected to the reliability test, the intrinsic defective cells affect the measurement result to disable proper evaluation of defective cells to be subjected to the reliability test.

In the semiconductor memory device employing the read scheme based on the current continuous flow scheme of the first to eighth embodiments, when the source lines of cells of a plurality of columns which are simultaneously selected are commonly connected, the common source line floats due to the cell current of cells of columns. For this reason, a variation in the threshold voltage of a cell of a specific column, which is generated by floating of the source line potential due to the cell current of the cell, cannot be measured while excluding floating of the source line potential due to the cell current of cells of other columns.

Normally, when the distribution of threshold voltages of cells in the semiconductor memory device is to be measured, the accumulated number of bits in reading out data of level "1" ("H" level output) at each measurement point of the threshold voltage must be detected by a tester, and then, the difference in the accumulated number of bits between two adjacent threshold voltage measurement points must be calculated. To obtain a bitmap for a certain threshold voltage, two accumulated bitmaps must be acquired, and the difference between the bitmaps must be calculated. This processing is not easy to perform.

As described above, in the first to eighth embodiments, when a defective bit in terms of reliability is to be detected by the reliability improvement test in development, the measurement result is affected by an intrinsic defective bit for which read/write/erase cannot be performed, so the defect in terms of reliability cannot be discriminated from the intrinsic defect.

A ninth embodiment for solving this problem will be described below. According to the ninth embodiment, when a defective bit in terms of reliability is to be detected by the reliability improvement test, evaluation can be made while excluding the influence of intrinsic defective bits. Therefore, the test can be performed while excluding the influence of the intrinsic defective bit even before redundancy replacement. In addition, any variation in threshold voltage, which is generated by floating of the source line potential due to the cell current of a selected cell, can be measured without causing floating of the source line potential due to the cell current of cells of other columns. Furthermore, the current leakage between adjacent bit lines, the threshold voltage of each cell, and distribution of threshold voltages can be easily measured.

Ninth Embodiment

Figure 18:
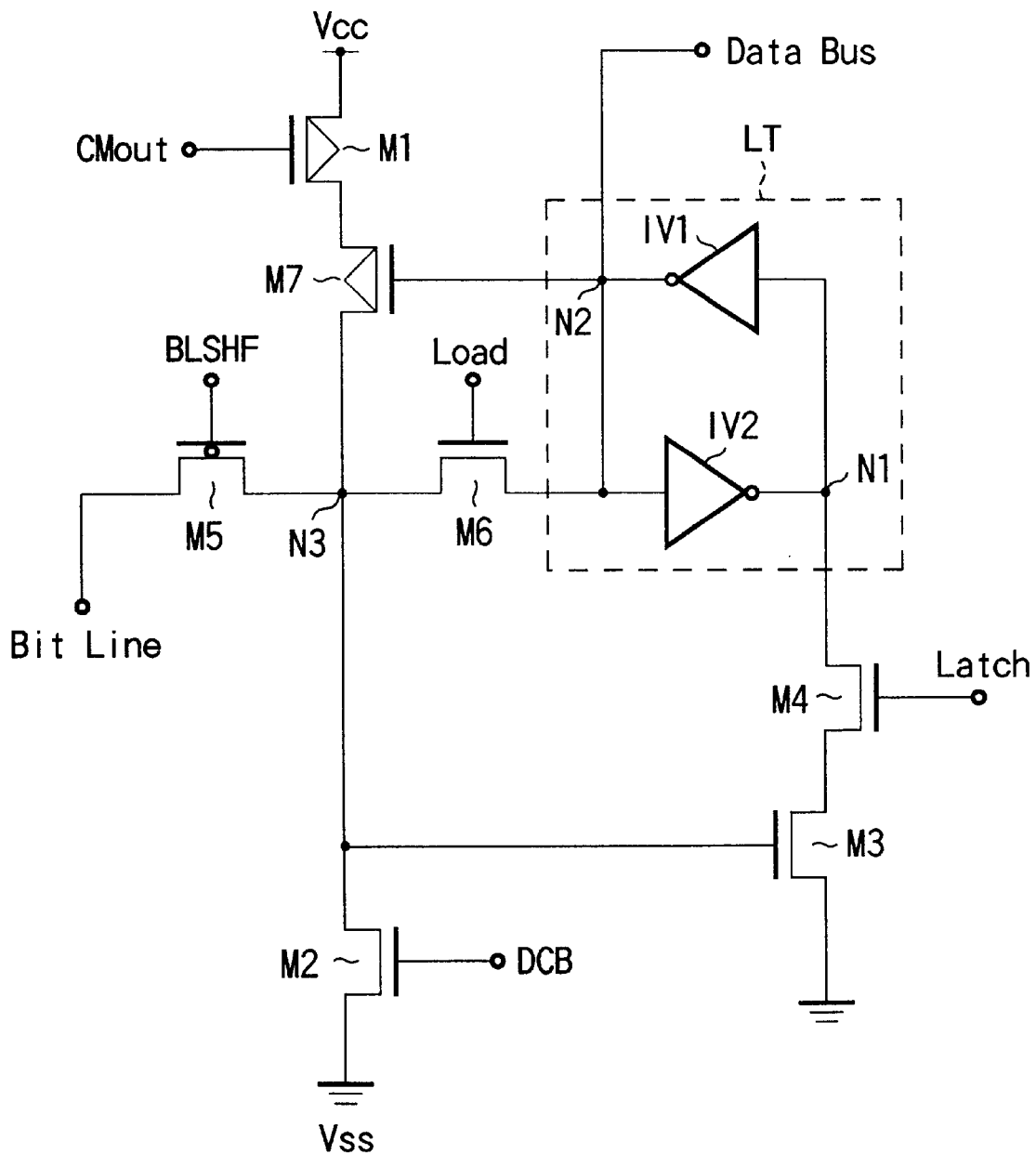
FIG. 18 is a circuit diagram showing a sense amplifier in a NAND EEPROM as a semiconductor memory device according to a ninth embodiment of the present invention.

FIG. 18 shows a sense amplifier for a NAND EEPROM as a semiconductor memory device according to the ninth embodiment of the present invention. The entire arrangement of the NAND EEPROM is the same as that of the prior art shown in FIGS. 1 to 3.

The sense amplifier shown in FIG. 18 employs as a sense scheme, a so-called current continuous flow scheme of detecting the potential of a bit line potential sense node, which depends on the relationship in amplitude between the current for charging the bit line BL from a current source and the discharge current flowing to the selected cell in reading out data from a memory cell in the memory cell array 11 shown in FIG. 1 in which a plurality of nonvolatile memory cells are arrayed in a matrix, and as a read scheme, a page read scheme of simultaneously reading out data from a plurality of memory cells connected to a plurality of bit lines BL and detecting the potential. The sense amplifier is arranged in units of bit lines BL of a NAND EEPROM which has a verify mode after the writing operation in the memory cell (FIG. 3). However, the read scheme is not limited to the page read scheme.

The sense amplifier shown in FIG. 18 has the same arrangement as that of the first embodiment shown in FIG. 5.

More specifically, the constant current source P-channel MOSFET M1 charges the bit line BL for a predetermined period on the basis of the bit line charge control signal CMout.

The bit line clamp N-channel MOSFET M5 is inserted in series with the bit line BL and has a gate to which the control voltage BLSHF is applied.

The latch circuit LT latches memory cell data read out to the bit line potential sense node N3 between the P-channel MOSFET M1 and the N-channel MOSFET M5.

The reset circuit N-channel MOSFET M2 discharges charges from the bit line potential sense node N3 for a predetermined period on the basis of the discharge control signal DCB.

The bit line potential sense N-channel MOSFET M3 is connected between the first latch node N1 of a pair of complementary nodes of the latch circuit LT and the ground node and has a gate connected to the bit line potential sense node N3.

The sense timing determination N-channel MOSFET M4 is connected in series with the N-channel MOSFET M3 between the first latch node N1 of the latch circuit LT and the ground node and turned on in accordance with the control signal Latch applied to the gate for a predetermined period (the N-channel MOSFET M4 controls forcible inversion of the latch circuit LT).

The sense amplifier reset/latch data transfer N-channel MOSFET M6 is inserted between the bit line potential sense node N3 and the second latch node N2 of the pair of complementary nodes of the latch circuit LT, gate-driven in accordance with the control signal Load which is set at the ground potential in the read mode and in the verify read mode, turned off in reading out data from the memory cell, and turned on in writing data in the memory cell.

The switch circuit M7 turns on/off the charge path to the bit line potential sense node N3 in accordance with data of the latch circuit LT. The switch circuit M7 is turned on in resetting the latch circuit LT, and turned off in the forcibly inverted state of the latch circuit LT.

In the ninth embodiment, as the switch circuit M7, a P-channel MOSFET inserted between the constant current source P-channel MOSFET M1 and the bit line potential sense node N3, having a gate connected to the second latch node N2 of the latch circuit LT (node which is set at "L" level in the reset state and "H" level in the forcibly inverted state), and turned on/off in accordance with data of the second latch node N2 is used.

The constant current source P-channel MOSFET M1 is normally controlled to charge the bit line BL at the end of the discharge period of the reset circuit. The charge potential of the bit line BL is not limited to a power supply voltage $V_{cc}$.

The latch circuit LT comprises a flip-flop circuit (latch circuit) constituted by cross-connecting (inversely parallelly connecting) the input nodes and output nodes of the first CMOS inverter IV1 and the second CMOS inverter IV2. The input node (first latch node N1) of the first CMOS inverter IV1 is connected to the sense timing determination N-channel MOSFET M4 as a forcible inversion input node. The input node (second latch node N2) of the second CMOS inverter IV2 is connected to the N-channel MOSFET M6 for sense amplifier reset and also connected to the data bus as a reset node.

The operation of the NAND EEPROM according to the ninth embodiment will be described below.

(1) In the read mode, the sense amplifier is reset, and then, a read is performed, as in the first embodiment shown in FIG. 6.

(2) In the read for reliability test or the like, the control method and operation of the sense amplifier after the read test mode is set upon receiving a read test command (the read test mode) are different from those in the read mode (1). More specifically, the control method and operation are the same as those in the read mode except those of the N-channel MOSFET M6.

According to the ninth embodiment, in the read test mode, the read sequence is controlled such that the ON/OFF of charging of the bit lines is determined in accordance with the latch data of the sense amplifier without resetting the sense amplifier, thereby charging only specific bit lines of the bit line group, which are connected to cells from which data is to be read out.

As the latch data of the sense amplifier, desired data (data which changes depending on the column to be read or the column not to be read) is written in advance using the serial data input function used in the normal write mode. In this case, data is input to the sense amplifier corresponding to the column to be read such that the node N2 is set at "L" level (the MOSFET M7 is turned on) and to the sense amplifier corresponding to the column not to be read such that the node N2 is set at "H" level (the MOSFET M7 is turned off).

Figure 19:
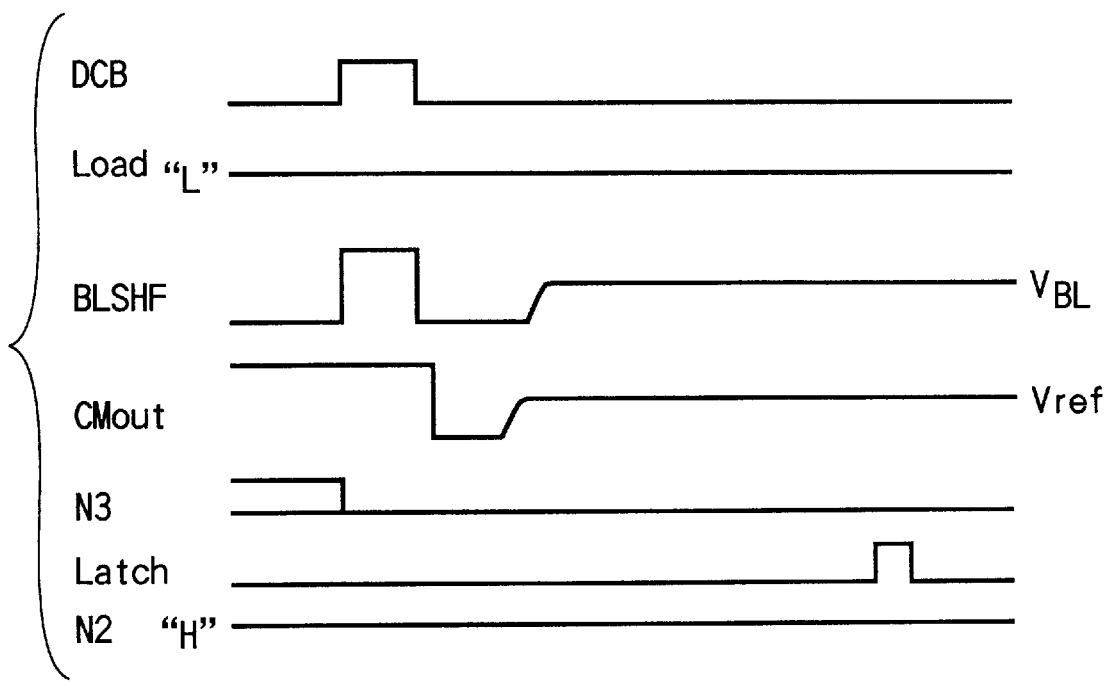
FIGS. 19 and 20 are timing charts showing an example of the read sequence of the ninth embodiment in a read test mode.
Figure 20:
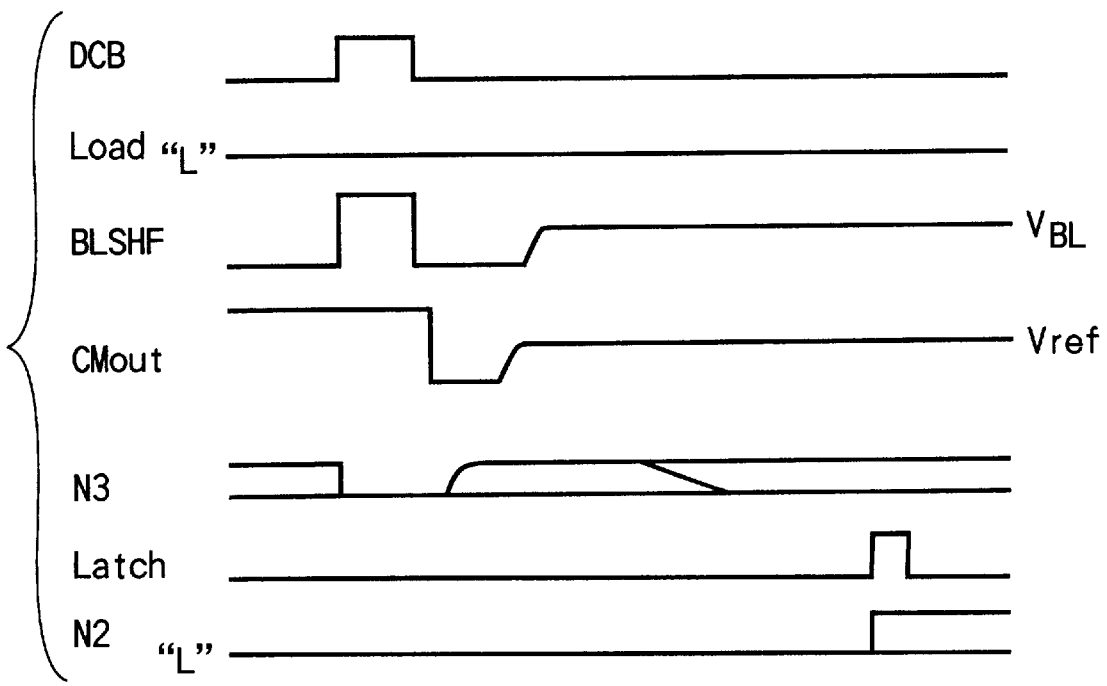

FIGS. 19 and 20 are timing charts respectively showing read sequences after data of "H" level and data of "L" level are latched to the node N2 in the read test mode of the sense amplifier shown in FIG. 18.

In the read test mode, the operation of the MOSFET M6 is different from that in the read mode of the first embodiment shown in FIG. 6.

More specifically, when the read operation is to be started after data is latched to the sense amplifier, the bit line potential sense node N3 is discharged while the MOSFET M2 is turned on for a predetermined period and simultaneously the MOSFET M5 is turned on. However, the MOSFET M6 is not turned on (the latch circuit LT is not reset).

With this arrangement, ON/OFF of charging of the bit line can be determined in accordance with latch data of the sense amplifier. As shown in FIG. 20, only the MOSFETs M7 of sense amplifiers which have received data for setting the nodes N2 at "L" level are turned on. As shown in FIG. 19, the MOSFETs M7 of sense amplifiers which have received data for setting the node N2 at "H" level are turned off.

After this, when the current source MOSFET M1 is turned on, the bit line connected to the MOSFET M7 which is turned on (only a specific bit line of the bit line group, which is connected to a cell to be read) can be selectively charged.

As described above, when only the bit line BL connected to the cell to be read is charged with the constant current from the MOSFET M1, and the bit line BL is discharged to flow a cell current $I_{cell}$ generated depending on the threshold state of the cell transistor while keeping the constant current flow, and the MOSFET M4 is turned on for a predetermined period after a predetermined time, the sense amplifier corresponding to the cell to be read can read out cell data, as shown in FIG. 20.

In the sense amplifier corresponding to a column not to be read, the bit line potential sense node N3 is kept at "L" level, the node N1 is kept at "L" level, and the node N2 is kept at "H" level, as shown in FIG. 19.

Therefore, when the data read out to the sense amplifier is compared with the input data written before the read test mode is set, the read test can be performed.

In the operation in the read test mode, the process of turning on the MOSFETs M2 and M5 for a predetermined period to discharge the bit line potential sense node N3 may be omitted. More specifically, the sense amplifier employing the current continuous flow scheme is used herein. Even when the bit line potential sense node N3 is at "H" level, the bit line can be determined as a column not to be read as far as the bit line charge path from the constant current source is turned off by the MOSFET M7. However, to exclude the influence of discharge from the bit line potential sense node N3 to the bit line, the bit line potential sense node N3 is preferably reset, as described above.

In the ninth embodiment, a column having an intrinsic defective bit which has been detected by a die sort test or the like in advance is determined as a column not to be read. Therefore, the data can be read out while excluding the influence of the intrinsic defective bit. By comparing the read out data with input data latched before the read test mode is set, the read test can be conducted while excluding the intrinsic defective bit.

When a column having an intrinsic defective bit which has been detected by a die sort test or the like in advance is determined as a column not to be read, the test can be performed as if the device were a complete nondefective device in which the column having the intrinsic defective bit is replaced with a redundant column.

When the read test is performed while setting one column as an object to be subjected to measurement and the remaining columns not to be read, the variation in threshold voltage of one cell of the selected column, which is generated by floating of the source line potential due to the cell current of the cell, can be measured (measurement can be performed while excluding the influence of floating of the source line potential due to the cell current of the cells of the remaining columns).

The NAND EEPROM of the ninth embodiment has the above-described read test function. When the actual performance of the device is to be measured by the reliability improvement test in development, the performance can be properly evaluated while excluding the influence of the intrinsic defective bit. This also allows a test before redundancy replacement (redundancy function). In addition, any variation in the threshold voltage of a cell of the selected column, which is generated by floating of the source line potential due to the cell current of the cell, can be measured.

Tenth Embodiment

Figure 21:
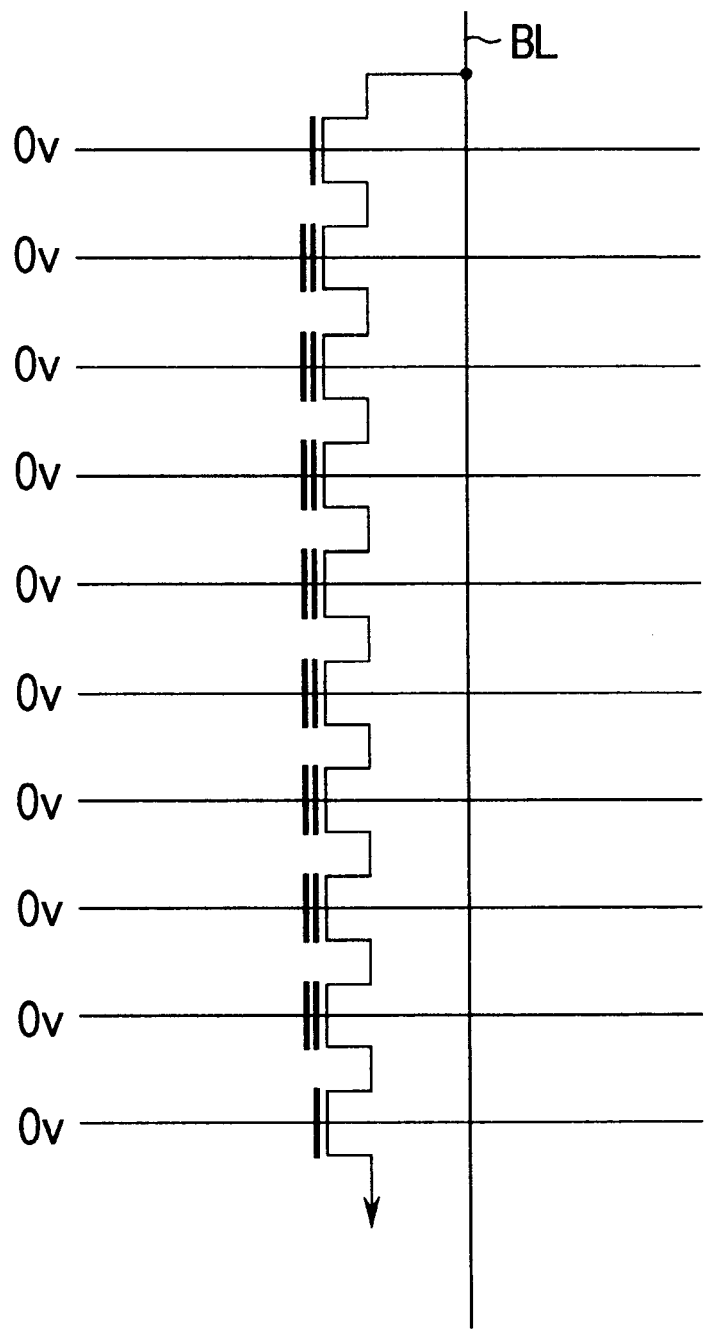
FIG. 21 is a circuit diagram showing a sense amplifier in a NAND EEPROM as a semiconductor memory device according to a tenth embodiment of the present invention.

A NAND EEPROM of a tenth embodiment has the same arrangement as that of the first embodiment except that the NAND EEPROM has a whole nonselection operation mode for applying a voltage of, e.g., 0V to the word lines of all NAND cells to set them in the nonselected state, as shown in FIG. 21, and the control method and operation of the sense amplifier in the read test mode are the same as in the ninth embodiment.

In the tenth embodiment, when data is to be loaded in the sense amplifier before the read test mode is set, data (checker pattern data) in which data of level "1" and data of level "0" alternate is latched to the sense amplifier array in the row direction of the cell array such that columns to be read and columns not to be read alternate.

The circuit state of the whole nonselection operation mode as shown in FIG. 21 is set, and the read test mode is set. Charged bit lines and bit lines which have not been charged alternate. Since current leakage between adjacent bit lines lowers the potential of the charged bit line, the presence/absence of current leakage between adjacent bit lines can be easily measured.

Eleventh Embodiment

Figure 22:
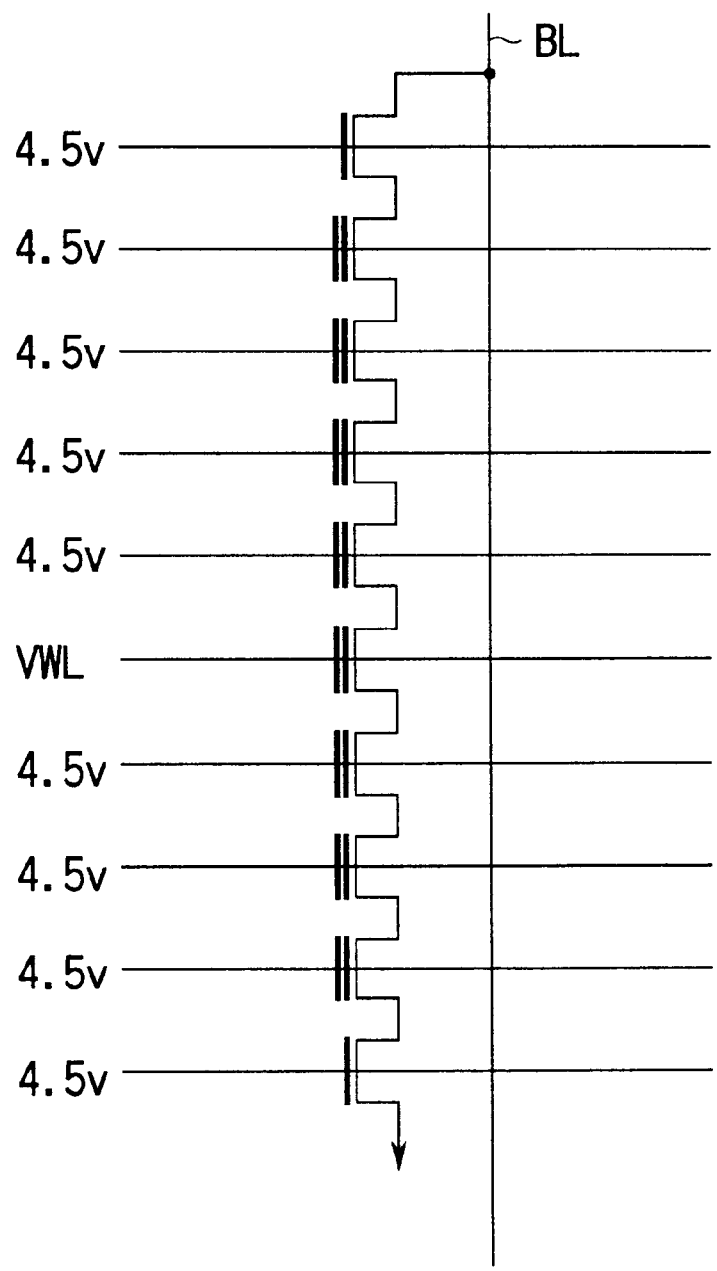
FIG. 22 is a circuit diagram showing a sense amplifier in a NAND EEPROM as a semiconductor memory device according to an eleventh embodiment of the present invention.

A NAND EEPROM of an eleventh embodiment has the same arrangement as that of the first embodiment except that the EEPROM has a threshold test mode for applying a threshold test voltage VWL of an arbitrary level from an external unit to the word line of a desired NAND cell and simultaneously applying a voltage (e.g., 4.5V) for setting cells in the ON state to the word lines of the remaining NAND cells, as shown in FIG. 22, and the control method and operation of the sense amplifier in the read test mode are the same as in the ninth embodiment.

In the eleventh embodiment, when the distribution of threshold voltages of cells is to be measured, input data is set first such that all columns are to be read, and more specifically, the node N2 of each sense amplifier is set at "L" level, and the node N1 of each sense amplifier is set at "H"

level. In the circuit state of the threshold test mode shown in FIG. 22, the threshold test voltage VWL for the cells of an arbitrarily selected row is set at a certain measurement point (positive voltage), and the read test mode is set. When the number of bits in reading out data of level "1" ("L" level output) is detected by a tester, columns connected to cells each having a threshold voltage lower than the measurement point of the threshold test voltage VWL in the selected row can be detected. This operation is repeatedly performed for all selected rows, thereby obtaining the bitmap of cells each having a threshold voltage lower than the measurement point of the threshold test voltage VWL.

Next, the threshold test voltage VWL for the cells of the arbitrarily selected row is set at a measurement point higher than the previous measurement point by one step, and the read test mode is set. At this time, the already acquired bitmap data is used as input data to set the columns to which cells each having a threshold voltage lower than the threshold test voltage, which has already undergone measurement, as columns not to be read (exclude the columns). In this state, the target number of bits can be detected by the tester. This operation is repeatedly performed for all selected rows, thereby obtaining the bitmap of cells each having a threshold voltage lower than the threshold test voltage VWL for every measurement point.

As described above, in the eleventh embodiment, when the distribution of threshold voltages of cells is to be measured, the number of bits in reading out data of level "1" is detected for every measurement point of the threshold voltage. A column to which cells each having a threshold voltage lower than the past measurement point belongs is set as a column not to be read. With this arrangement, only cells at a new measurement point of the threshold voltage can be easily measured.

Unlike the prior art, the difference in accumulated number of bits between two adjacent threshold voltage measurement points need not be calculated after detection of the accumulated number of bits in reading out data of level "1" at each measurement point of the threshold voltage. For this reason, the scale of hardware such as a memory for storing bitmap data for calculation or the load on software for calculation can be made small.

In addition, in the eleventh embodiment, when the distribution of threshold voltages of cells is to be measured, an operation of obtaining the bitmap of cells each having a threshold voltage higher than the threshold test voltage VWL, sequentially lowering the measurement point by one step, and obtaining the bitmap of cells each having a threshold voltage higher than the threshold test voltage for every measurement point may be repeated. In this case, by sensing only bit line potential sense nodes N3 of sense amplifiers corresponding to cells each having a threshold voltage higher than the past measurement point, the nodes N2 and N1 have already been forcibly inverted to "H" level and "L" level, respectively. For this reason, without inputting new input data for every measurement at each measurement point, the latch data of the sense amplifier can be directly used to set the column to which already measured cells each having a threshold voltage higher than the threshold test voltage belong as columns not to be read, thereby obtaining a bitmap.

Twelfth Embodiment

Figure 23:
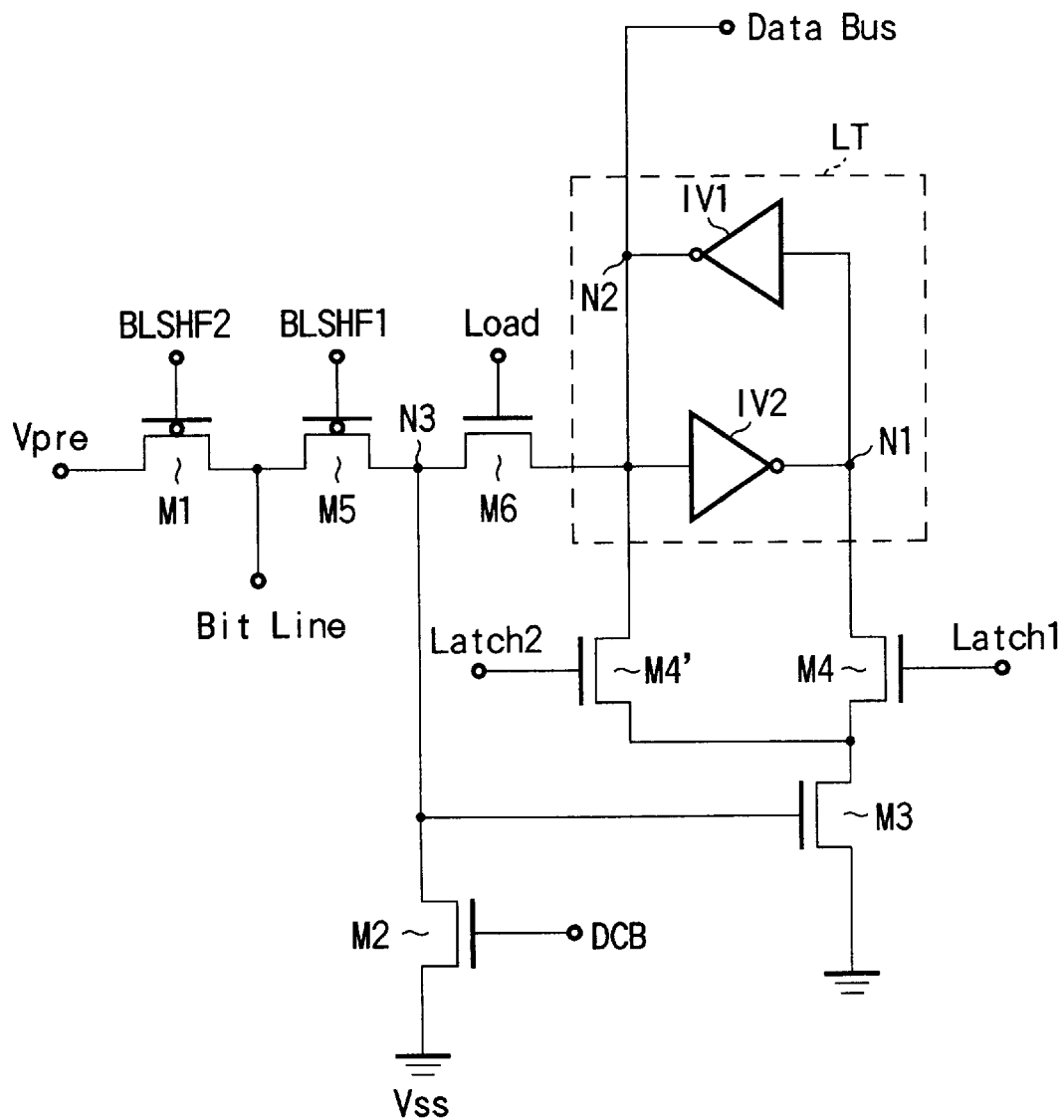
FIG. 23 is a circuit diagram showing a sense amplifier in a NAND EEPROM as a semiconductor memory device according to a twelfth embodiment of the present invention.

FIG. 23 shows a sense amplifier for a NAND EEPROM as a semiconductor memory device according to a twelfth embodiment of the present invention.

The sense amplifier shown in FIG. 23 is arranged in units of bit lines BL of a NAND EEPROM which has a so-called free running read scheme of charging the bit lines BL from the current source, then stopping charging of the bit lines BL (setting the bit lines BL in the floating state), and detecting the potential of a bit line potential sense node, which depends on the cell current, by the sense amplifier in detecting data from a memory cell in a memory cell array in which a plurality of nonvolatile memory cells are arrayed in a matrix.

This NAND EEPROM is also assumed to have a page read scheme of simultaneously reading out data from a plurality of memory cells connected to a plurality of bit lines BL and detecting the potential, as in the ninth embodiment. However, the read scheme is not limited to this.

In the sense amplifier shown in FIG. 23, the N-channel MOSFET M5 is inserted between the bit line BL and the bit line potential sense node N3 and has a gate to which the control voltage BLSHF1 is applied.

The latch circuit LT latches memory cell data read out to the bit line potential sense node N3 on one terminal side of the N-channel MOSFET M5.

The reset circuit N-channel MOSFET M2 discharges charges from the bit line potential sense node N3 for a predetermined period on the basis of the reset control signal DCB.

The bit line potential sense N-channel MOSFET M3 is connected between the first latch node N1 of a pair of complementary nodes of the latch circuit LT and the ground node and has a gate connected to the bit line potential sense node N3.

A first sense timing determination N-channel MOSFET M4 is connected in series with the N-channel MOSFET M3 between the first latch node N1 of the latch circuit LT and the ground node and turned on in accordance with a control signal Latch1 supplied to the gate for a predetermined period (the N-channel MOSFET M4 controls forcible inversion of the latch circuit).

A second sense timing determination N-channel MOSFET M4' is connected in series with the N-channel MOSFET M3 between the second latch node N2 of the latch circuit LT and the ground node and turned on in accordance with a control signal Latch2 supplied to the gate for a predetermined period (the N-channel MOSFET M4' controls forcible inversion of the latch circuit).

The sense amplifier reset/latch data transfer N-channel MOSFET M6 is inserted between the bit line potential sense node N3 and the second latch node N2 (the node N2 is connected to the data bus) of the pair of complementary nodes of the latch circuit LT, gate-driven in accordance with the control signal Load, turned off in reading out data from the memory cell, and turned on in writing data in the memory cell.

The precharge power supply transfer N-channel MOSFET M1 is connected between a precharge power supply $V_{pre}$ and the bit line BL, switched on the basis of a precharge control signal BLSHF2, and charges the bit line BL for a predetermined period.

The sense amplifier shown in FIG. 23 has the same arrangement as that of the first embodiment shown in FIG. 5 except the operation of the precharge power supply transfer MOSFET M1.

In the read mode, the MOSFETs M2 and M6 are turned on for a predetermined period, and simultaneously, the MOSFET M5 is turned on to discharge the node N3.

Subsequently, the precharge power supply transfer N-channel MOSFET M1 is turned on for a predetermined period to precharge the bit line BL from the precharge power supply $V_{pre}$ through the MOSFET M1 and simultaneously precharge the sense node N3 through the MOSFET M5.

Upon completion of precharge, the bit line BL is set in the floating state. In this state, the bit line BL is discharged to flow a cell current $I_{cell}$ generated depending on the threshold voltage of the cell MOSFET. When the MOSFET M4 is turned on for a predetermined period after a predetermined time (read time), the bit line potential (this potential corresponds to cell data) can be read out by the sense amplifier.

In this case, when the cell MOSFET is of an enhancement type (in the written state), the sense node N3 is kept at "H" level, and the nodes N1 and N2 are set at "L" level and "H" level, respectively. To the contrary, when the cell MOSFET is of a depletion type (in the nonwritten/erased state), the sense node N3 is discharged to "L" level. Therefore, the nodes N1 and N2 are kept at "H" level and "L" level, respectively.

Figure 24:
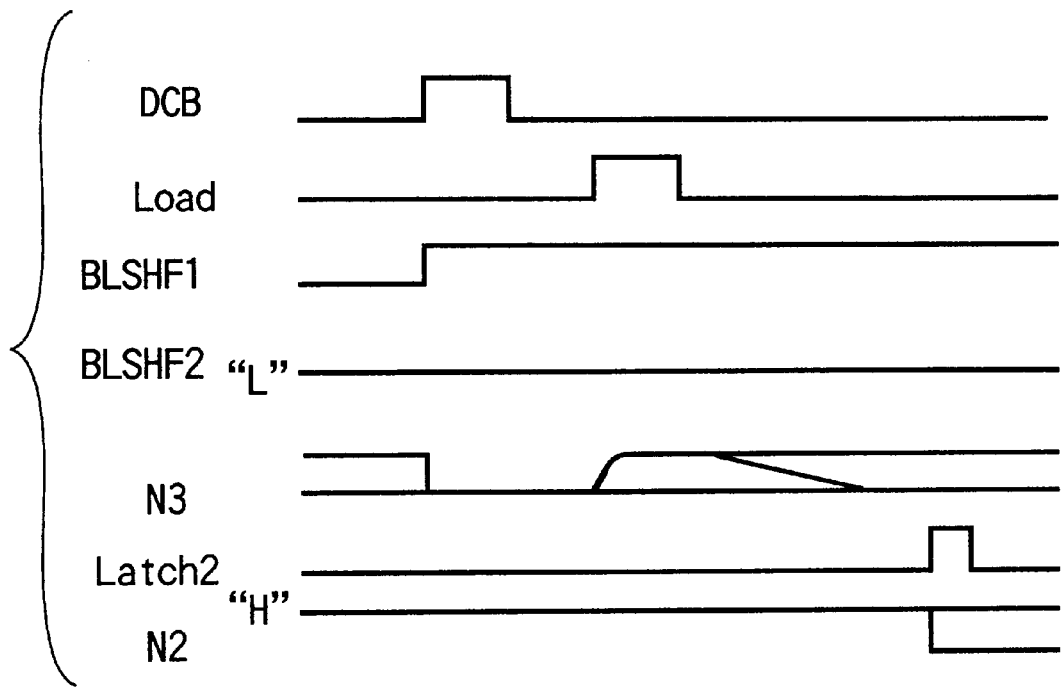
FIGS. 24 and 25 are timing charts showing an example of the read sequence of the twelfth embodiment in a read test mode.
Figure 25:
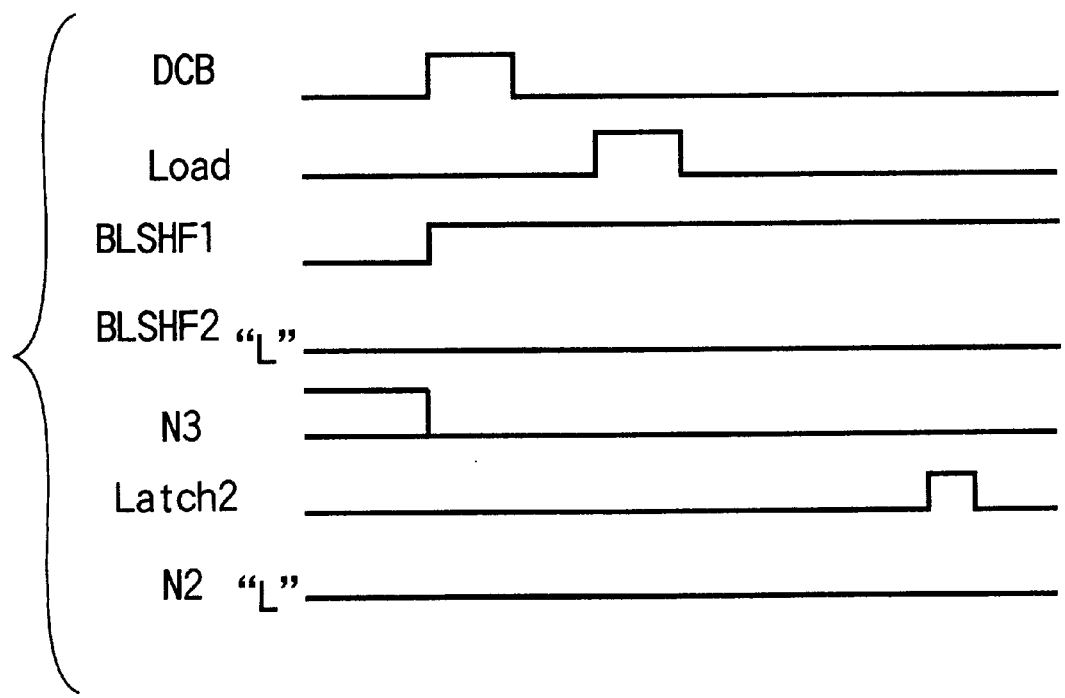

FIGS. 24 and 25 are timing charts respectively showing read sequences after data of "H" level and data of "L" level are latched to the node N2 in the read test mode of the sense amplifier shown in FIG. 23.

In the read test mode, before the start of reading, desired data (the data set depending on whether the column is to be read) is written from the data bus using the serial data input function used in the normal write mode.

In this case, data is input to a sense amplifier corresponding to a column to be read such that the node N2 is set at "H" level and to a sense amplifier corresponding to a column not to be read such that the node N2 is set at "L" level, thereby latching the data.

In the read test mode, sequence control to be described below is performed to determine ON/OFF of precharge of bit lines in accordance with the latch data of the sense amplifiers without resetting the sense amplifiers. With this operation, only specific bit lines of the bit line group, which are connected to cells to be read, can be precharged.

More specifically, after data is latched to the sense amplifier in the above-described manner, the MOSFET M2 is turned on for a predetermined period, and simultaneously, the MOSFET M5 is turned on to discharge the node N3 without turning on the MOSFET M6 (without resetting the latch circuit LT of the sense amplifier). After this, the precharge power supply transfer N-channel MOSFET M1 is turned off, and the MOSFET M6 is turned on for a predetermined period while the MOSFET M5 is kept turned on.

In this case, since data of "H" level is written in the node N2 of the sense amplifier corresponding to the column to be read, the sense node N3 is precharged from the node N2 set at "H" level through the MOSFET M6. After the sense node N3 is sufficiently precharged, the MOSFET M6 is turned off to set the bit line BL and the sense node N3 in the floating state.

Note that the reset operation of turning on the MOSFETs M2 and M5 for a predetermined period to discharge the node N3 can be omitted, as in the ninth embodiment.

The subsequent read operation is the same as the above-described operation upon completion of precharge in the read mode. More specifically, when the bit line BL connected to a cell to be read is discharged to flow the cell current $I_{cell}$ generated on the basis of the threshold state of the cell MOSFET, and the MOSFET M4' is turned on for a predetermined period after a predetermined time (read time), the bit line potential (this potential corresponds to cell data) of the read column can be read out by the sense amplifier. In the read test mode, since the node N2 of the sense amplifier of the read column is set at "H" level, the MOSFET M4' is turned on for a predetermined period to store the node N2 at "H" level or forcibly invert the node N2 to "L" level, and the potential is sensed.

By contrast, the node N2 of the sense amplifier corresponding to a column not to be read is set at "L" level. The sense node N3 is not precharged from the node N2, so the bit line potential is kept at "L" level while the node N2 is kept at "L" level.

Therefore, when data is written in the sense amplifier corresponding to a column to be or not to be read (e.g., a column including an intrinsic defective bit), and data read out to the sense amplifier is compared with the input data which has been written before the read test mode is set, as described above, the read test can be performed.

As described above, the twelfth embodiment using the free running type sense amplifier can obtain the same effects as those of the ninth embodiment (proper evaluation can be made while excluding the influence of an intrinsic defective bit, and a test before redundancy replacement is also enabled).

In addition, even when the free running type sense amplifier is used in the tenth embodiment under the same control as that of the twelfth embodiment, the same effect as that of the tenth embodiment can be obtained (the presence/absence of current leakage between adjacent bit lines can be easily measured).

Furthermore, even when the free running type sense amplifier is used in the eleventh embodiment under the same control as that of the twelfth embodiment, the same effect as that of the eleventh embodiment can be obtained (when the distribution of threshold voltages of cells is to be measured, the scale of hardware or load on software for calculation can be made small).

Thirteenth Embodiment

Figure 26:
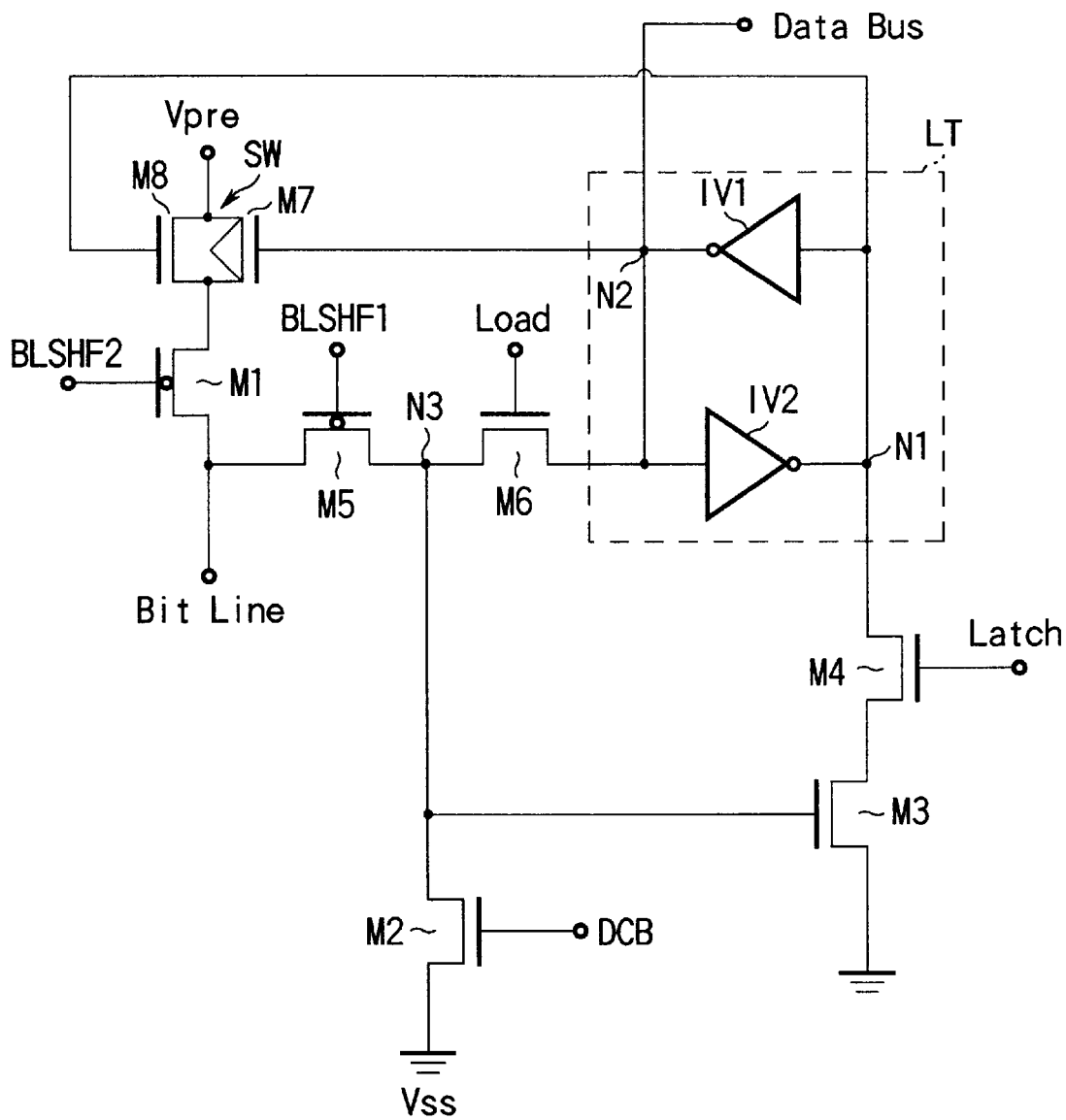
FIG. 26 is a circuit diagram showing a sense amplifier in a NAND EEPROM as a semiconductor memory device according to a thirteenth embodiment of the present invention.

FIG. 26 shows a sense amplifier for a NAND EEPROM as a semiconductor memory device according to a thirteenth embodiment of the present invention.

The sense amplifier shown in FIG. 26 has the same arrangement as that of the twelfth embodiment shown in FIG. 23 except that the switch circuit SW is inserted between the precharge power supply transfer N-channel MOSFET M1 and the precharge power supply $V_{pre}$, and the second sense timing determination N-channel MOSFET M4' between the second latch node N2 of the latch circuit LT and the bit line potential sense N-channel MOSFET M3 is omitted.

The switch circuit SW is switched on the basis of data of the latch circuit LT to charge the bit line BL for a predetermined period. The switch circuit SW is turned on in the reset state of the latch circuit LT and off in the forcibly inverted state of the latch circuit LT.

In this embodiment, a CMOS transfer gate parallelly connecting a P-channel MOSFET M7 and an N-channel MOSFET M8 is used as the switch circuit SW. The P-channel MOSFET M7 has a gate connected to the second latch node N2 (the second latch node N2 is set at "L" level in the reset state and "H" level in the forcibly inverted state) and switched in accordance with data of the second latch node N2. The N-channel MOSFET M8 has a gate connected to the first latch node N1 (the first latch node N1 is set at "H"

level in the reset state and "L" level in the forcibly inverted state) of the latch circuit LT and switched in accordance with data of the first latch node N1.

Figure 27:
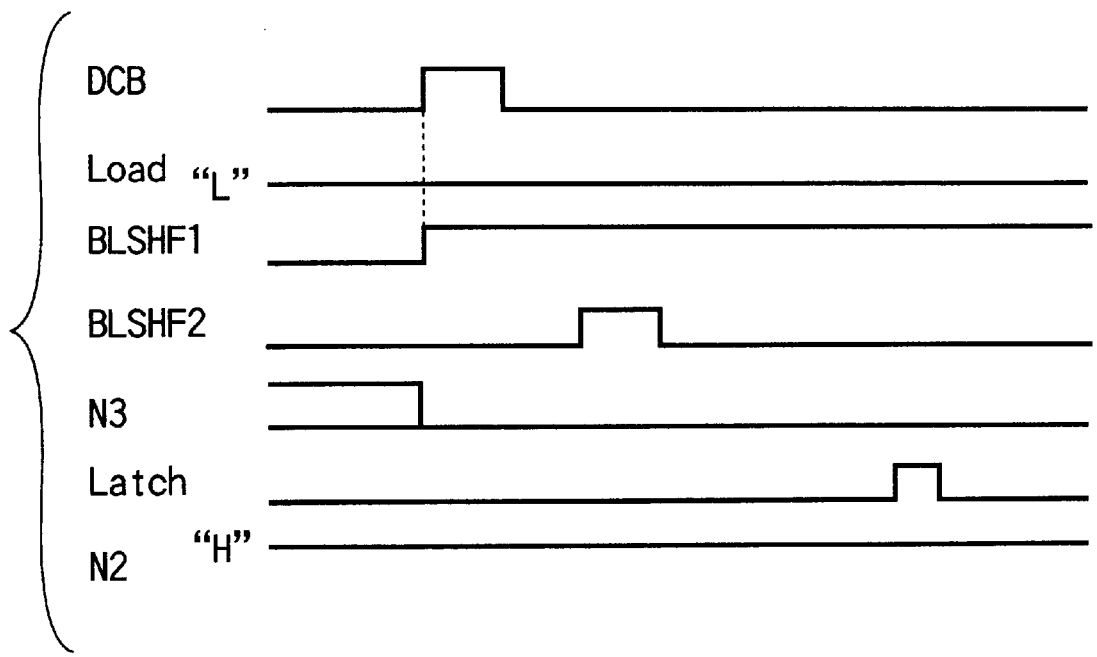
FIGS. 27 and 28 are timing charts showing an example of the read sequence of the thirteenth embodiment in a read test mode.
Figure 28:
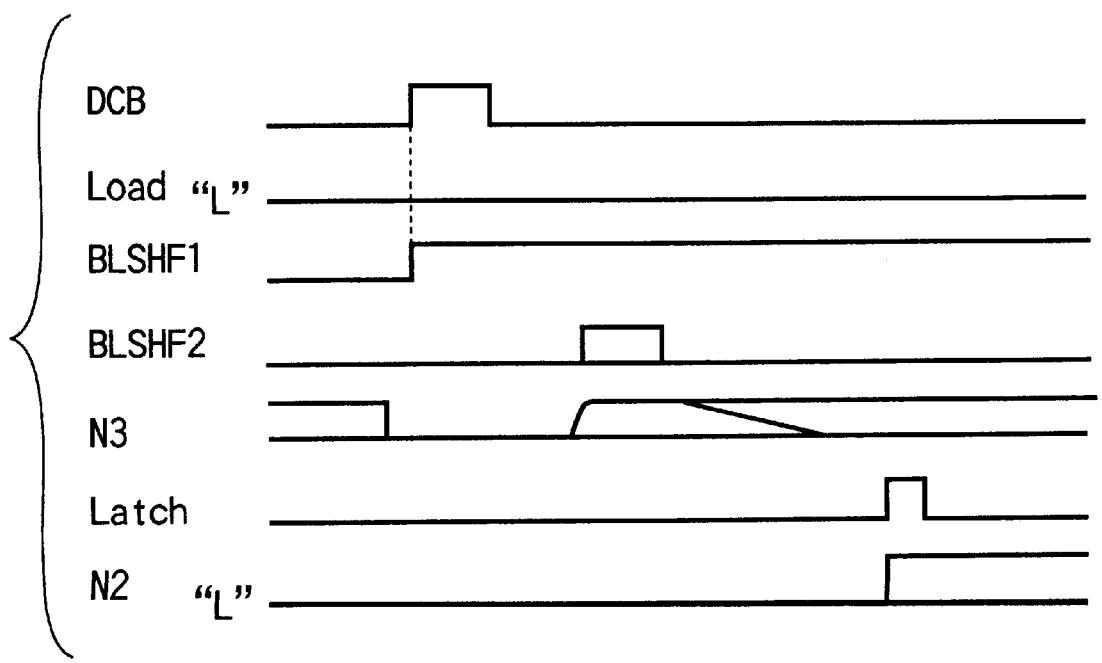

FIGS. 27 and 28 are timing charts respectively showing read sequences after data of "H" level and data of "L" level are latched to the node N2 in the read test mode of the sense amplifier of the thirteenth embodiment.

While data is latched to the sense amplifier, MOSFETs M2 and M5 are turned on for a predetermined period to discharge the node N3 and bit line without turning on the MOSFET M6 (without resetting the latch circuit LT of the sense amplifier). After this, the precharge power supply transfer N-channel MOSFET M1 is turned on while the MOSFET M6 is kept turned off. With this operation, the switch circuit SW can be ON/OFF-controlled in accordance with the latch data of the sense amplifier to determine ON/OFF of precharge of the bit line. Therefore, only specific bit lines of the bit line group, which are connected to cells to be read, can be precharged.

In this case, when data of "L" level is written in the node N2 of a sense amplifier corresponding to a column to be read, the switch circuit SW is turned on because the node N2 is set at "L" level while the node N1 is set at "H" level, so the sense node N3 is precharged through the MOSFET M1. When the sense node is sufficiently precharged, and the MOSFET N1 is turned off, the bit line BL and the sense node N3 are set in the floating state.

The subsequent read operation is the same as in the read mode. More specifically, the bit line BL connected to a cell to be read is discharged to flow a cell current $I_{cell}$ generated on the basis of the threshold state of the cell MOSFET, and the MOSFET M4 is turned on for a predetermined period after a predetermined time (read time). The bit line potential (this potential corresponds to cell data) of the read column can be read out by the sense amplifier.

On the other hand, the node N2 of the sense amplifier corresponding to a column not to be read is set at "H" level. The switch circuit SW is turned off because the node N2 is set at "H" level while the node N1 is set at "L" level. The sense node N3 is not precharged, so the bit line potential is kept at "L" level while the node N2 is kept at "L" level.

Therefore, when data is written in the sense amplifier corresponding to a column to be or not to be read (e.g., a column including an intrinsic defective bit), and data read out to the sense amplifier is compared with the input data which has been written before the read test mode is set, as described above, the read test can be performed.

Fourteenth Embodiment

In a fourteenth embodiment, the operation of the ninth embodiment is applied to the sense amplifier of the second embodiment shown in FIG. 7.

The operation of this embodiment is the same as that of the ninth embodiment. When the node N2 is set at "L", the bit line charge current flows. When the node N2 is set at "H" level, the bit line charge current stops.

Fifteenth Embodiment

In a fifteenth embodiment, the operation of the ninth embodiment is applied to the sense amplifier of the third embodiment shown in FIG. 8.

The operation of this embodiment is the same as that of the ninth embodiment. When the node N2 is set at "L", the bit line charge current flows. When the node N2 is set at "H" level, the bit line charge current stops.

Sixteenth Embodiment

In a sixteenth embodiment, the operation of the ninth embodiment is applied to the sense amplifier of the fourth embodiment shown in FIG. 9.

The operation of this embodiment is the same as that of the ninth embodiment. When the node N2 is set at "L", the bit line charge current flows. When the node N2 is set at "H" level, the bit line charge current stops.

In this way, according to the ninth to sixteenth embodiments, when the actual performance of the device is to be measured by a reliability improvement test in development, the device can be properly evaluated while excluding the influence of an intrinsic defective bit. A test before redundancy replacement is also enabled. In addition, the amplitude of variation in threshold voltage which is generated by floating of the source line potential due to the cell current of a selected cell can be measured while excluding the influence of floating of the source line potential due to the cell current of the cells of the remaining columns. Current leakage between adjacent bit lines, the threshold voltages of cells, and the distribution of the threshold voltages can also be easily measured.

Seventeenth Embodiment

In a seventeenth embodiment, the operation of the tenth embodiment is applied to the sense amplifier of the twelfth embodiment shown in FIG. 23.

Eighteenth Embodiment

In an eighteenth embodiment, the operation of the tenth embodiment is applied to the sense amplifier of the thirteenth embodiment shown in FIG. 26.

Nineteenth Embodiment

In a nineteenth embodiment, the operation of the tenth embodiment is applied to the sense amplifier of the fourteenth embodiment.

Twentieth Embodiment

In a twentieth embodiment, the operation of the tenth embodiment is applied to the sense amplifier of the fifteenth embodiment.

Twenty-first Embodiment

In a twenty-first embodiment, the operation of the tenth embodiment is applied to the sense amplifier of the sixteenth embodiment.

Twenty-second Embodiment

In a twenty-second embodiment, the operation of the eleventh embodiment is applied to the sense amplifier of the twelfth embodiment shown in FIG. 23.

Twenty-third Embodiment

In a twenty-third embodiment, the operation of the eleventh embodiment is applied to the sense amplifier of the thirteenth embodiment shown in FIG. 26.

Twenty-fourth Embodiment

In a twenty-fourth embodiment, the operation of the eleventh embodiment is applied to the sense amplifier of the fourteenth embodiment.

Twenty-fifth Embodiment

In a twenty-fifth embodiment, the operation of the eleventh embodiment is applied to the sense amplifier of the fifteenth embodiment.

Twenty-sixth Embodiment

In a twenty-sixth embodiment, the operation of the eleventh embodiment is applied to the sense amplifier of the sixteenth embodiment.

The present invention can be applied not only to the NAND EEPROM as in the above embodiments but also another EEPROM (e.g., a NOR EEPROM, a DINOR EEPROM, and an AND EEPROM) having a page mode.

Figure 29:
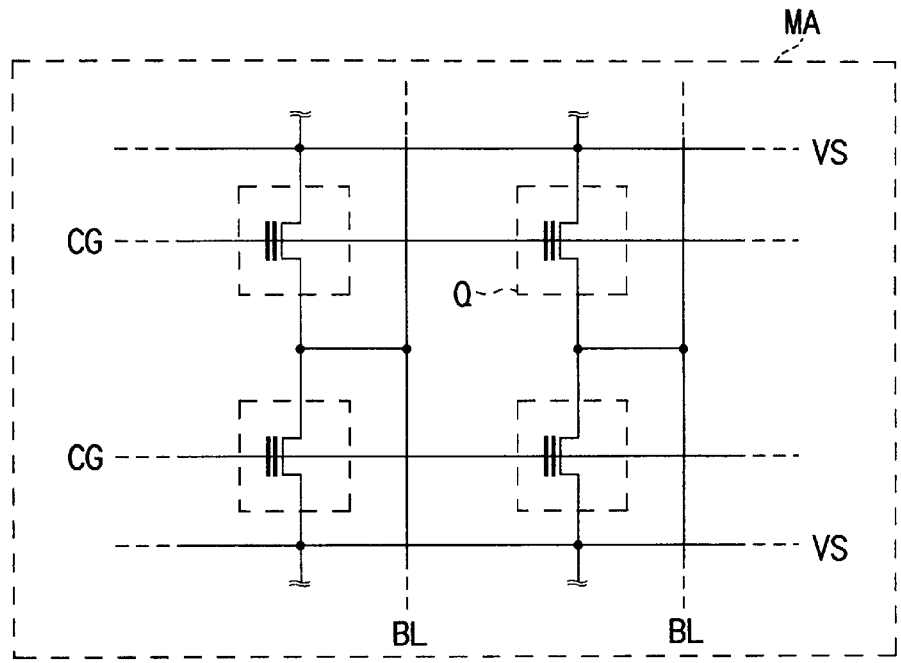
FIGS. 29 and 30 are circuit diagrams showing examples of the memory cell of a NOR EEPROM as a modification of the present invention.
Figure 30:
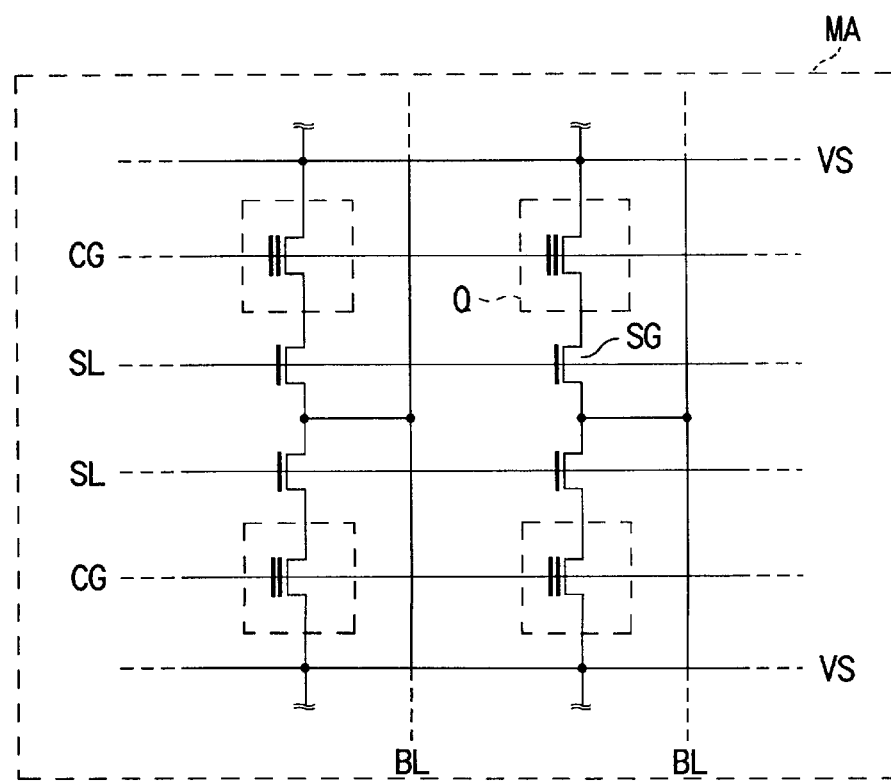

FIGS. 29 and 30 show some memory cells of a memory cell array MA of a NOR EEPROM.

In FIG. 29, a cell MOSFET Q controlled by a control gate signal line CG is connected between the bit line BL and a source line VS perpendicular to the bit line BL as a memory cell having no selection circuit.

In FIG. 30, a bit-line-side selection MOSFET SG controlled by a selection signal line SL and a cell MOSFET Q controlled by a control gate signal line CG are connected between the bit line BL and a source line VS perpendicular to the bit line BL as a memory cell having a selection circuit.

Figure 31:
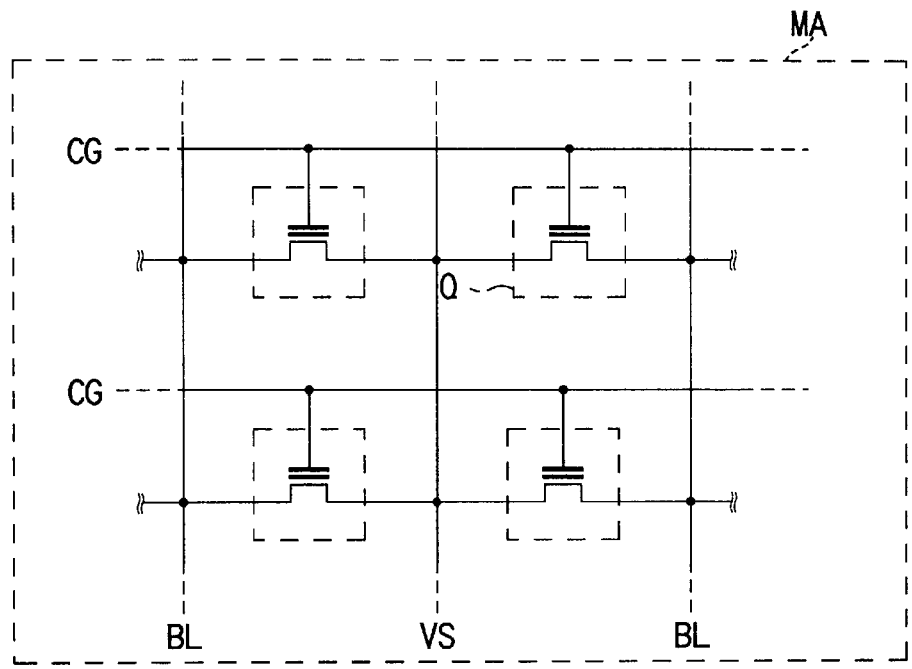
FIG. 31 is a circuit diagram showing an example of the memory cell of a ground array NOR EEPROM as a modification of the present invention.
Figure 32:
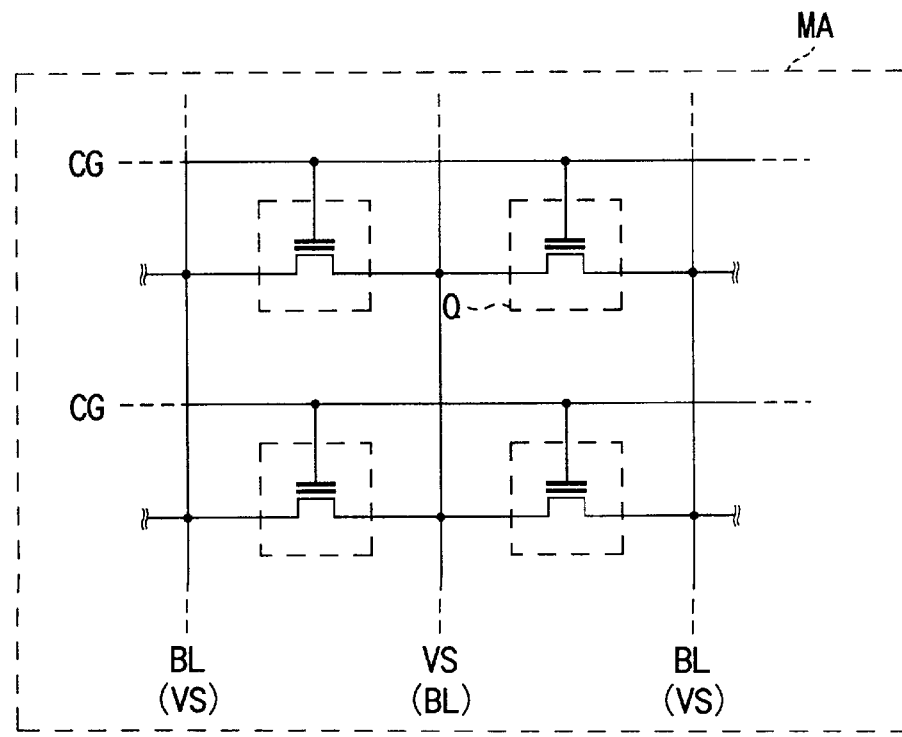
FIG. 32 is a circuit diagram showing an example of the memory cell of an alternate ground array NOR EEPROM as a modification of the present invention.

FIGS. 31 and 32 show some memory cells of a memory cell array MA of a ground array EEPROM as another example of the NOR EEPROM.

In FIG. 31, a cell MOSFET Q controlled by a control gate signal line CG is connected between a bit line BL and a source line VS parallel to a bit line BL. The bit line BL and a source line VS are fixed.

FIG. 32 shows memory cells of an alternate ground array EEPROM. A cell MOSFET Q controlled by a control gate signal line CG is connected between the bit line BL and a source line VS parallel to the bit line BL. The bit line BL and the source line VS can be exchanged.

Figure 33:
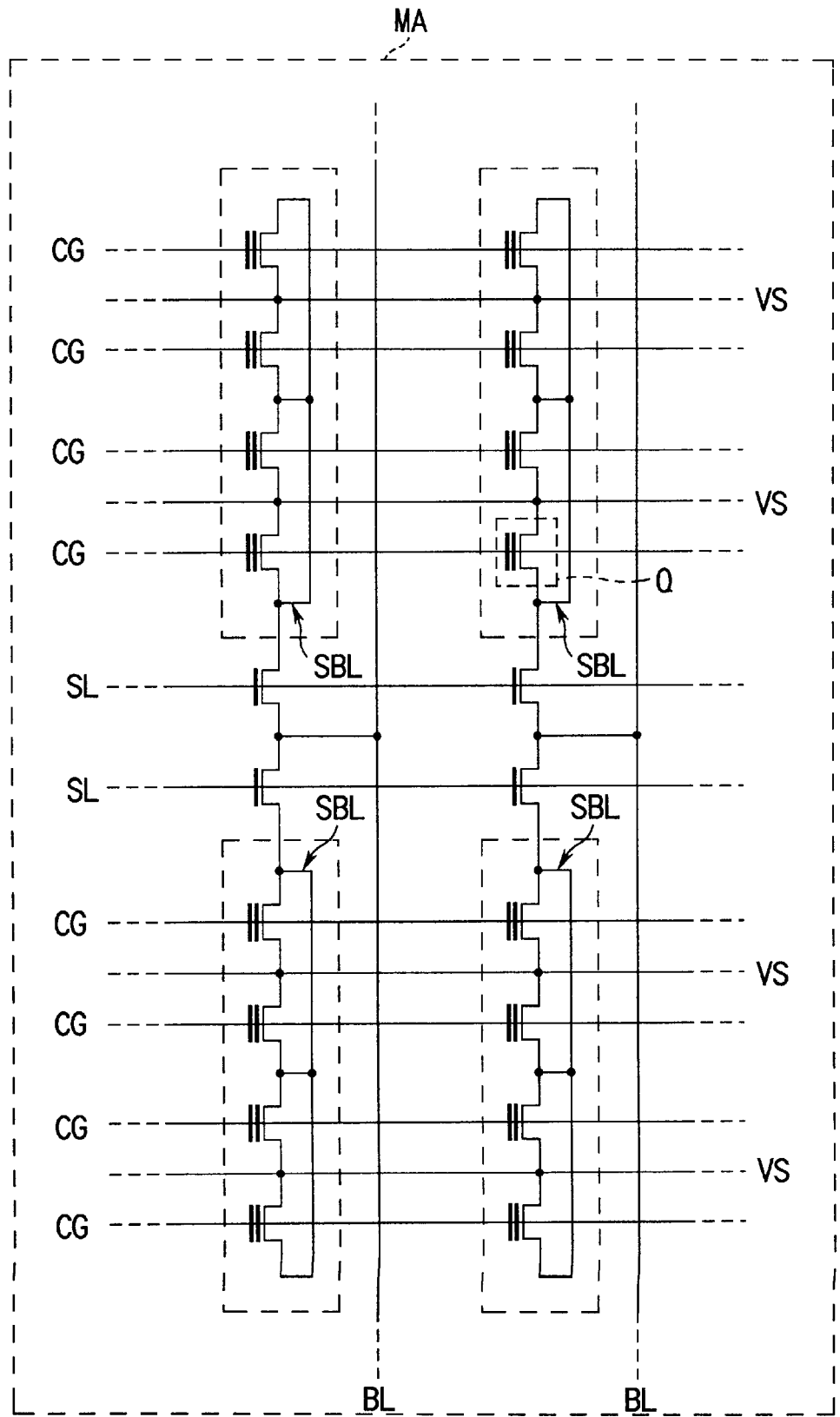
FIG. 33 is a circuit diagram showing an example of the memory cell of a divided NOR (DINOR) EEPROM as a modification of the present invention.

FIG. 33 shows a memory cell of a memory cell array MA of a divided NOR (DINOR) EEPROM.

A plurality of cell MOSFETs Q controlled by a control gate signal line CG are parallel-connected between a sub-bit lines $S_{BL}$ and a plurality of source lines VS. The sub-bit lines $S_{BL}$ are connected to a bit line BL through a bit-line-side selection MOSFET SG controlled by a selection signal line SL.

Figure 34:
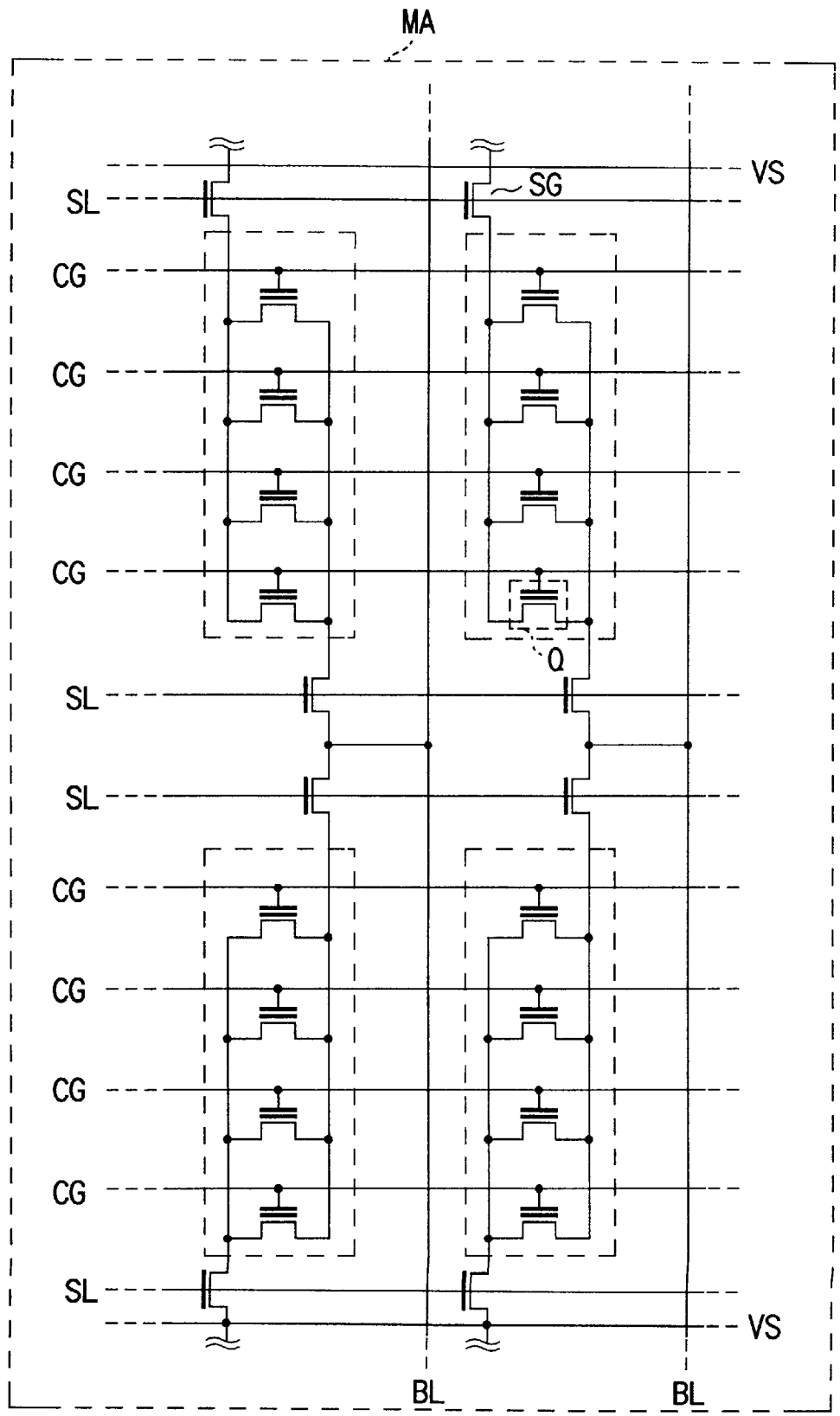
FIG. 34 is a circuit diagram showing an example of the memory cell of an AND EEPROM as a modification of the present invention.

FIG. 34 shows a memory cell of a memory cell array MA of an AND EEPROM.

A bit-line-side selection MOSFET SG controlled by a selection signal line SL and a plurality of cell MOSFETs Q which are respectively controlled by control gate signal lines CG and connected in parallel with each other are connected in series between a bit line BL and a source line VS.

As has been described above, according to the present invention, there is provided a semiconductor memory device which can suppress floating of the potential of the common source line of a plurality of memory cells in the verify operation after the write even when the plurality of memory cells include a memory cell having a high write speed, thereby preventing a write failure.

In addition, according to the present invention, there is also provided a semiconductor memory device which allows proper evaluation while excluding the influence of an intrinsic defective bit when the actual performance of the device is to be measured by a reliability improvement test in development, a test before redundancy replacement, measurement of the amplitude of variation in threshold voltage which is generated by floating of the source line potential due to the cell current of a selected cell while excluding the influence of floating of the source line potential due to the cell current of the cells of the remaining columns, and also easy measurement of a current leakage between adjacent bit lines, the threshold voltages of cells, and the distribution of the threshold voltages.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as determined by the appended claims and their equivalents.

What is claimed is:

1. A semiconductor memory device comprising:
    a plurality of bit lines;
    a plurality of nonvolatile memory cells arranged in correspondence with said bit lines, each having a memory cell transistor for storing data upon setting a threshold value within a first range or a second range, simultaneously selected and controlled to discharge or not to discharge corresponding bit lines in accordance with the threshold value, and having paths of the discharged charges commonly connected; and
    a plurality of sense amplifiers, arranged in correspondence with said bit lines, configured to detect memory cell data read out to one end of the corresponding ones of said bit lines, each of said sense amplifiers comprising:
        a current source, arranged in correspondence with each of said bit lines, configured to charge the corresponding bit line at a predetermined timing;
        a latch circuit configured to latch data corresponding to the range of the threshold value of said memory cell transistor, the latch circuit having a pair of complementary nodes;
        a bit line potential sense MOSFET connected between a first node of the pair of complementary nodes of said latch circuit and a ground node and having a gate connected to said one end of the corresponding ones of said bit lines; and
        a switch circuit configured to turn on/off a charge path of the corresponding bit line based on latch data of a second node of the pair of complementary nodes of said latch circuit.

2. The device according to claim 1, wherein said switch circuit is inserted in a charge path for said one end of the corresponding bit line of said bit line.

3. The device according to claim 1, wherein
    said switch circuit is inserted in a charge path between said one end of the corresponding bit line of said bit line and said nonvolatile memory cell.

4. The device according to claim 1, in which
    said latch circuit is reset in reading out data from said nonvolatile memory cell, and then, stores a reset state or is forcibly inverted in accordance with the data read out to said one end of the corresponding bit line, and
    said switch circuit is turned on in the reset state of said latch circuit and off in the inverted state of said latch circuit.

5. The device according to claim 4, wherein
    said switch circuit comprises a P-channel MOSFET having a gate connected to a node which is set at "L" level in the reset state of said latch circuit and "H" level in the forcibly inverted state of said latch circuit.

6. The device according to claim 4, wherein
said switch circuit comprises an N-channel MOSFET having a gate connected to a node which is set at "H" level in the reset state of said latch circuit and "L" level in the forcibly inverted state of said latch circuit.

7. The device according to claim 1, wherein
said bit line potential sense MOSFET comprises a bit line potential sense N-channel MOSFET, and
said sense amplifier comprises:
a bit line potential clamp N-channel MOSFET inserted in series with a bit line between said one end of the corresponding ones of said bit lines and said nonvolatile memory cell;
a sense timing determination N-channel MOSFET connected between said bit line potential sense N-channel MOSFET and said first node of said latch circuit and turned on/off in accordance with a signal supplied to a gate for a predetermined period; and
a sense amplifier reset/transfer gate N-channel MOSFET inserted between said one end of the corresponding ones of said bit lines and said second node of said pair of complementary nodes of said latch circuit, turned off in reading out data from said nonvolatile memory cell, and turned on in resetting said latch circuit and writing data in said nonvolatile memory cell.

8. The device according to claim 1, wherein said nonvolatile memory cell constitutes a NAND cell formed of a plurality of electrically erasable and programmable memory cell transistors which are series-connected.

9. A semiconductor memory device comprising:
a plurality of bit lines;
a plurality of nonvolatile memory cells arranged in correspondence with said bit lines, each having a memory cell transistor for storing data upon setting a threshold value within a first range or a second range, simultaneously selected and controlled to discharge or not to discharge corresponding bit lines in accordance with the threshold value, and having paths of the discharged charges commonly connected;
a plurality of sense amplifiers arranged in correspondence with said bit lines configured to detect memory cell data read out to one end of the corresponding ones of said bit lines, each of said sense amplifiers comprising a current source, arranged in correspondence with each of said bit lines, configured to detect the corresponding bit line at a predetermined timing, and a latch circuit configured to latch data corresponding to the range of the threshold value of said memory cell transistor; and
a control circuit configured to decrease an amplitude of a current of said current source charging said bit line in a verify mode to be smaller than that in a read mode.

10. The device according to claim 9, wherein said control circuit prolongs a read time of said sense amplifier in the verify mode to be longer than that in the read mode.

11. The device according to claim 9, wherein said control circuit prolongs a read time of said sense amplifier in inverse proportion to the current of said current source for charging said bit line.

12. The device according to claim 9, wherein said control circuit increases a load resistance of said bit line in the verify mode to be larger than that in the read mode.

13. The device according to claim 12, wherein said control circuit prolongs a read time of said sense amplifier in proportion to the load resistance of said bit line.

14. The device according to claim 9, wherein said nonvolatile memory cell constitutes a NAND cell formed of a plurality of electrically erasable and programmable memory cell transistors which are series-connected.

15. A sense amplifier connected to a bit line of a semiconductor memory device for detecting memory cell data read out to a one end of the bit line, the sense amplifier comprising:
a current source configured to supply a current to the one end of the bit line at a predetermined timing;
a latch circuit having first and second nodes, the second node receiving a voltage in accordance with a voltage of the one end of the bit line;
a bit line potential sense MOSFET connected between the first node of said latch circuit and a ground node and having a gate connected to said one end of the bit line; and
a switch transistor, connected between the current source and the one end of the bit line and having a gate connected to the second node of the latch circuit, and being turned on/off in accordance with a voltage of the second node.

16. The sense amplifier according to claim 15, further comprising:
a latch circuit inverting transistor connected between the first node of the latch circuit and the bit line potential sense MOSFET.

17. The sense amplifier according to claim 15, further comprising:
a discharge transistor, connected between the one end of the bit line and the ground terminal, for discharging charges at the one end of the bit line.

18. The sense amplifier according to claim 15, further comprising:
a latch circuit inverting transistor connected to the second sense node of the latch circuit;
a bit line sense transistor connected between the latch circuit inverting transistor and a ground terminal and having a gate connected to the one end of the bit line; and
a discharge transistor, connected between the one end of the bit line and the ground terminal, for discharging charges at the one end of the bit line.

19. The sense amplifier according to claim 15, wherein said sense amplifier senses a potential of the one end of the bit line in accordance with a relationship between a current for charging the bit line from the current source and a discharge current flowing to the memory cell and further comprising a read controller for resetting the sense amplifier and then performing a read operation in a normal read mode.

20. The sense amplifier according to claim 19, wherein said sense amplifier senses a potential of the one end of the bit line in accordance with a cell current after charging the bit line from the current source and then stopping charging of the bit line and further comprising a read controller for resetting the sense amplifier and then performing a read operation in a normal read mode.

21. A sense amplifier connected to a bit line of a semiconductor memory device for detecting memory cell data read out to a one end of the bit line, the sense amplifier comprising:
a current source, supplying a current to the one end of the bit line at a predetermined timing;
a latch circuit having first and second nodes, the second node receiving a voltage in accordance with a voltage of the one end of the bit line;

a bit line potential sense MOSFET connected between the first node of said latch circuit and a ground node and having a gate connected to said one end of the bit line;

a switch transistor, connected between the current source and the one end of the bit line and having a gate connected to the first node of the latch circuit, and being turned on/off in accordance with a voltage of the first node.

22. The sense amplifier according to claim 21, further comprising:

a latch circuit inverting transistor connected between the first node of the latch circuit and the bit line potential sense MOSFET.

23. The sense amplifier according to claim 21, further comprising:

a discharge transistor, connected between the one end of the bit line and the ground terminal, for discharging charges at the one end of the bit line.

24. The sense amplifier according to claim 21, further comprising:

a latch circuit inverting transistor connected to the second sense node of the latch circuit;

a bit line sense transistor connected between the latch circuit inverting transistor and a ground terminal and having a gate connected to the one end of the bit line; and a discharge transistor, connected between the one end of the bit line and the ground terminal, for discharging charges at the one end of the bit line.

25. The sense amplifier according to claim 21, wherein said sense amplifier senses a potential of the one end of the bit line in accordance with a relationship between a current for charging the bit line from the current source and a discharge current flowing to the memory cell and further comprising a read controller for resetting the sense amplifier and then performing a read operation in a normal read mode.

26. The sense amplifier according to claim 21, wherein said sense amplifier senses a potential of the one end of the bit line in accordance with a cell current after charging the bit line from the current source and then stopping charging of the bit line and further comprising a read controller for resetting the sense amplifier and then performing a read operation in a normal read mode.

27. A sense amplifier connected to a bit line of a semiconductor memory device for detecting memory cell data read out to a one end of the bit line, the sense amplifier comprising:

a current source, supplying a current to the one end of the bit line at a predetermined timing;

a latch circuit having first and second nodes, the first node receiving a voltage in accordance with a voltage of the one end of the bit line;

a bit line potential sense MOSFET connected between the first node of said latch circuit and a ground node and having a gate connected to said one end of the bit line; and a switch transistor, connected between the memory cell and the one end of the bit line and having a gate connected to the first node of the latch circuit, and being turned on/off in accordance with a voltage of the first node.

28. The sense amplifier according to claim 22, further comprising:

a latch circuit inverting transistor connected between the first node of the latch circuit and the bit line potential sense MOSFET.

29. The sense amplifier according to claim 27, further comprising:

a discharge transistor, connected between the one end of the bit line and the ground terminal, for discharging charges at the one end of the bit line.

30. The sense amplifier according to claim 27, further comprising:

a latch circuit inverting transistor connected to the second sense node of the latch circuit;

a bit line sense transistor connected between the latch circuit inverting transistor and a ground terminal and having a gate connected to the one end of the bit line; and a discharge transistor, connected between the one end of the bit line and the ground terminal, for discharging charges at the one end of the bit line.

31. The sense amplifier according to claim 22, wherein said sense amplifier senses a potential of the one end of the bit line in accordance with a relationship between a current for charging the bit line from the current source and discharge current flowing to the memory cell and further comprising a read controller for resetting the sense amplifier and then performing a read operation in a normal read mode.

32. The sense amplifier according to claim 27, wherein said sense amplifier sense a potential of the one end of the bit line in accordance with a cell current after charging the bit line from the current source and then stopping charging of the bit line and further comprising a read controller for resetting the sense amplifier and then performing a read operation in a normal read mode.

33. A sense amplifier connected to a bit line of a semiconductor memory device for detecting memory cell data read out to a one end of the bit line, the sense amplifier comprising:

a current source, supplying a current to the one end of the bit line at a predetermined timing;

a latch circuit having first and second nodes, the second node receiving a voltage in accordance with a voltage of the one end of the bit line;

a bit line potential sense MOSFET connected between the first node of said latch circuit and a ground node and having a gate connected to said one end of the bit line; and a switch transistor, connected between the memory cell and the one end of the bit line and having a gate connected to the second node of the latch circuit, and being turned on/off in accordance with a voltage of the second node.

34. The sense amplifier according to claim 33, further comprising:

a latch circuit inverting transistor connected between the first node of the latch circuit and the bit line potential sense MOSFET.

35. The sense amplifier according to claim 33, further comprising:

a discharge transistor, connected between the one end of the bit line and the ground terminal, for discharging charges at the one end of the bit line.

36. The sense amplifier according to claim 33, further comprising:

a latch circuit inverting transistor connected to the second sense node of the latch circuit;

a bit line sense transistor connected between the latch circuit inverting transistor and a ground terminal and having a gate connected to the one end of the bit line; and a discharge transistor, connected between the one end of the bit line and the ground terminal, for discharging charges at the one end of the bit line.

37. The sense amplifier according to claim 33, wherein said sense amplifier senses a potential of the one end of the bit line in accordance with a relationship between a current for charging the bit line from the current source and a discharge current flowing to the memory cell and further comprising a read controller for resetting the sense amplifier and then performing a read operation in a normal read mode.

38. The sense amplifier according to claim 33, wherein said sense amplifier senses a potential of the one end of the bit line in accordance with a cell current after charging the bit line from the current source and then stopping charging of the bit line and further comprising a read controller for resetting the sense amplifier and then performing a read operation in a normal read mode.

39. The device according to claim 9, wherein said sense amplifier comprises:
   a current mirror transistor having a source connected to a power source and a gate connected to a gate of the current source transistor and to a drain of the current mirror transistor; and
   a control transistor, connected between the current mirror transistor and a ground terminal, having a gate whose voltage is controlled to decrease an amplitude of a current of said current source for charging said bit line in a verify mode to be smaller than that in a read mode.

40. The device according to claim 9, wherein said sense amplifier comprises:
   a current mirror transistor having a source connected to a power source and a gate connected to a gate of the current source transistor and to a drain of the current mirror transistor;
   a first control transistor connected between the current mirror transistor and a ground terminal; and
   a second control transistor connected between the gate of the current mirror transistor and the ground terminal, the first and second control transistors, being turned on to increase an amplitude of a current of said current source for charging said bit line in a read mode to be larger than that in a verify mode.

41. The device according to claim 9, wherein said sense amplifier comprises:
   a first current mirror transistor having a gate connected to a gate of the current source transistor;
   a first switching transistor connected between the first current mirror transistor and a power source, the first switching transistor being turned on in a verify mode and a read mode;
   a second current mirror transistor having a gate connected to the gate of the current source transistor;
   a second switching transistor connected between the second current mirror transistor and the power source, the second switching transistor being turned on in the verify mode; and
   a control transistor, connected between the first and second current mirror transistors and a ground terminal, having a gate whose voltage is controlled to decrease an amplitude of a current of said current source for charging said bit line in a verify mode to be smaller than that in a read mode.

42. The device according to claim 9, wherein said sense amplifier comprises:
   a first current source transistor, connected to the bit line, for charging the bit line at a predetermined timing;
   a first switching transistor, connected between the first current source transistor and a power source, which is turned on in a verify mode and a read mode;
   a second current source transistor, connected to the bit line, for charging the bit line at a predetermined timing;
   a second switching transistor, connected between the first current source transistor and the power source, which is turned on in the read mode;
   a current mirror transistor having a source connected to the power source and a gate connected to a drain of the current mirror transistor; and
   a control transistor, connected between the current mirror transistor and a ground terminal, having a gate whose voltage is controlled to decrease an amplitude of a current of said current source for charging said bit line in a verify mode to be smaller than that in a read mode.

43. A sense amplifier connected to a bit line of a semiconductor memory device for detecting memory cell data read out to a one end of the bit line, the sense amplifier comprising:
   a current source, connected to the one end of the bit line, for charging the bit line at a predetermined timing;
   a latch circuit having first and second nodes, the second node receiving a voltage in accordance with a voltage of the one end of the bit line;
   a bit line potential sense MOSFET connected between the first node of said latch circuit and a ground node and having a gate connected to said one end of the bit line; and
   a switching circuit formed of first and second transistors, connected between the current source and a precharge power source, a gate of the first transistor being connected to the first node of the latch circuit, and a gate of the second transistor being connected to the second node of the latch circuit, the switching circuit turning on/off a charge path of the bit line based on latch data of said latch circuit.

44. The sense amplifier according to claim 43, further comprising:
   a latch circuit inverting transistor connected between the first node of the latch circuit and the bit line potential sense MOSFET.

45. The sense amplifier according to claim 43, further comprising:
   a discharge transistor, connected between the one end of the bit line and the ground terminal, for discharging charges at the one end of the bit line.

46. The sense amplifier according to claim 43, further comprising:
   a latch circuit inverting transistor connected to the second sense node of the latch circuit;
   a bit line sense transistor connected between the latch circuit inverting transistor and a ground terminal and having a gate connected to the one end of the bit line; and
   a discharge transistor, connected between the one end of the bit line and the ground terminal, for discharging charges at the one end of the bit line.

47. The sense amplifier according to claim 43, wherein said sense amplifier senses a potential of the one end of the bit line in accordance with a relationship between a current for charging the bit line from the current source and a discharge current flowing to the memory cell and further comprising a read controller for resetting the sense amplifier and then performing a read operation in a normal read mode.

48. The sense amplifier according to claim 43, wherein said sense amplifier senses a potential of the one end of the bit line in accordance with a cell current after charging the bit line from the current source and then stopping charging of the bit line and further comprising a read controller for resetting the sense amplifier and then performing a read operation in a normal read mode.

49. A semiconductor memory device comprising:

a plurality of bit lines, each having one end;

a plurality of nonvolatile memory cells arranged in correspondence with said bit lines;

a plurality of latch circuits, each arranged in correspondence with said bit lines and having first and second nodes, the second node receiving a voltage in accordance with a voltage of the one end of the corresponding one bit line;

a plurality of current sources, each arranged in correspondence with each of said bit lines, and the current source supplying a current to the corresponding bit line for charging the corresponding bit line at a predetermined timing;

a plurality of bit line potential sense MOSFETs connected between the first node of the corresponding one of said latch circuits and a ground node and having a gate connected to said one end of the corresponding bit line; and a plurality of switch circuits connected to the current sources respectively, for determining whether the corresponding current source charges the corresponding bit line or not in accordance with a voltage of the first nodes of the corresponding latch circuits.

50. The device according to claim 49, wherein each of said switch circuit is connected between the corresponding current source and the one end of the corresponding bit line.

51. The device according to claim 49, wherein each of said switch circuits is connected to the one end of the corresponding bit line.

52. The device according to claim 49, wherein each of said latch circuits is reset in reading out data from said nonvolatile memory cell, and then, stores a reset state or is forcibly inverted in accordance with the data read out to the one end of the corresponding bit line, and each of said switch circuits is turned on in the reset state of said corresponding latch circuit and off in the inverted state of said latch circuit.

53. The device according to claim 52, wherein each of said switch circuits comprises a P-channel MOSFET having a gate connected to a node which is set at "L" level in the reset state of said latch circuit and "H" level in the forcibly inverted state of said latch circuit.

54. The device according to claim 52, wherein each of said switch circuits comprises an N-channel MOSFET having a gate connected to a node which is set at "H" level in the reset state of said latch circuit and "L" level in the forcibly inverted state of said latch circuit.

55. The device according to claim 49, wherein said nonvolatile memory cell constitutes a NAND cell formed of a plurality of electrically erasable and programmable memory cell transistors which are series-connected.

56. A semiconductor memory device comprising:

a plurality of bit lines;

a plurality of nonvolatile memory cells arranged in correspondence with said bit lines;

a plurality of latch circuits, each arranged in correspondence with said bit lines and having first and second nodes, the second node receiving a voltage in accordance with a voltage of the one end of the corresponding one bit line;

a plurality of current sources, each arranged in correspondence with each of said bit lines and supplying a current to the corresponding bit line at a predetermined timing;

a plurality of bit line potential sense MOSFETs connected between the first node of the corresponding one of said latch circuits and a ground node and having a gate connected to said one end of the corresponding bit line; and a control circuit for decreasing a amplitude of the current of said current sources to be supplied to the corresponding bit line in a verify mode to be smaller than that in a read mode.

57. The device according to claim 56, wherein said control circuit prolongs a read time of said latch circuits in the verify mode to be longer than that in the read mode.

58. The device according to claim 56, wherein said control circuit prolongs a read time of said latch circuits in inverse proportion to the current of said current sources for charging said bit lines.

59. The device according to claim 56, wherein said control circuit increases a load resistance of said bit lines in the verify mode to be larger than that in the read mode.

60. The device according to claim 59, wherein said control circuit prolongs a read time of said latch circuits in proportion to the load resistance of said bit lines.

61. The device according to claim 56, wherein said nonvolatile memory cell constitutes a NAND cell formed of a plurality of electrically erasable and programmable memory cell transistors which are series connected.

* * * * *

UNITED STATES PATENT AND TRADEMARK OFFICE
CERTIFICATE OF CORRECTION

PATENT NO.: 6,097,638
DATED: August 1, 2000
INVENTOR: Toshihiko HIMENO, et al.

It is certified that errors appear in the above-identified patent and that said Letters Patent is hereby corrected as shown below:

In claim 28, column 33, line 63:

"according to claim 22" has been replaced with –according to claim 27–

In claim 31, column 34, line 17:

"according to claim 22" has been replaced with –according to claim 27–

Signed and Sealed this

Twenty-ninth Day of May, 2001

Attest:

NICHOLAS P. GODICI

*Attesting Officer*   *Acting Director of the United States Patent and Trademark Office*